US012682967B2

(12) United States Patent
Jang et al.

(10) Patent No.: US 12,682,967 B2
(45) Date of Patent: Jul. 14, 2026

(54) OPERATING METHOD OF MEMORY DEVICE

(71) Applicant: SK hynix Inc., Icheon-si Gyeonggi-do (KR)

(72) Inventors: Jung Shik Jang, Icheon-si Gyeonggi-do (KR); Won Geun Choi, Icheon-si Gyeonggi-do (KR); In Su Park, Icheon-si Gyeonggi-do (KR); Woo Pyo Jeong, Icheon-si Gyeonggi-do (KR); Jung Dal Choi, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 93 days.

(21) Appl. No.: 18/733,182

(22) Filed: Jun. 4, 2024

(65) Prior Publication Data

US 2025/0201319 A1     Jun. 19, 2025

(30) Foreign Application Priority Data

Dec. 19, 2023    (KR) ......................... 10-2023-0185884

(51) Int. Cl.
*G11C 16/34*        (2006.01)
*G11C 16/04*        (2006.01)
*G11C 16/10*        (2006.01)
*G11C 16/26*        (2006.01)

(52) U.S. Cl.
CPC ...... *G11C 16/3459* (2013.01); *G11C 16/0483* (2013.01); *G11C 16/102* (2013.01); *G11C 16/26* (2013.01)

(58) Field of Classification Search
CPC ........... G11C 16/3459; G11C 16/0483; G11C 16/102; G11C 16/26; G11C 16/10; G11C 16/3404; G11C 29/36
USPC ........................................ 365/185.22, 185.24
See application file for complete search history.

(56) References Cited

U.S. PATENT DOCUMENTS

| | | | | |
|---|---|---|---|---|
| 11,508,449 B2* | 11/2022 | Lu | ........................... | G11C 16/32 |
| 2008/0175069 A1* | 7/2008 | Wang | ................. | G11C 16/3404 365/185.11 |
| 2009/0122617 A1* | 5/2009 | Noh | ................... | G11C 16/3404 365/185.24 |

(Continued)

FOREIGN PATENT DOCUMENTS

KR        1020230089346 A        6/2023

*Primary Examiner* — Michael T Tran
(74) *Attorney, Agent, or Firm* — WILLIAM PARK AND ASSOCIATES LTD.

(57)        ABSTRACT

The present disclosure relates to method of operating a memory device that includes programming program data by distributing the program data to a first memory cell group corresponding to a first drain select line and a second memory cell group corresponding to a second drain select line during a program operation of a selected memory block, reading memory cells included in each of the first memory cell group and the second memory cell group during a read operation of the selected memory block, and determining threshold voltages for the first memory cell group according to a read result for the first memory cell group and threshold voltages for the second memory cell group according to a read result for the second memory cell group and outputting data codes corresponding to combinations of the threshold voltages during a read operation of the selected memory block.

16 Claims, 22 Drawing Sheets

(56)     References Cited

U.S. PATENT DOCUMENTS

| | | | |
|---|---|---|---|
| 2015/0227124 A1 * | 8/2015 | Arya | H02J 3/32 |
| | | | 700/286 |
| 2019/0288964 A1 * | 9/2019 | Dunne | H04L 51/04 |
| 2021/0272610 A1 * | 9/2021 | Roehr | G11C 7/06 |
| 2022/0392549 A1 * | 12/2022 | Markov | G11C 16/0425 |
| 2023/0197176 A1 * | 6/2023 | Shah | G11C 5/005 |
| | | | 365/185.03 |
| 2023/0335212 A1 * | 10/2023 | Markov | G11C 16/3445 |

* cited by examiner

FIG. 2
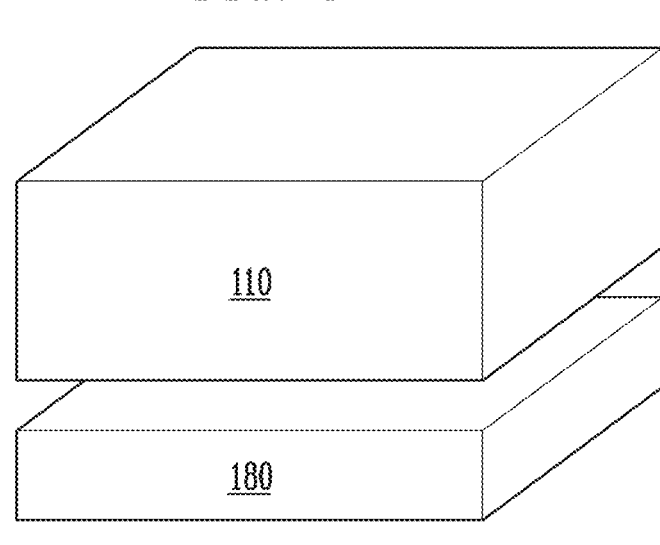
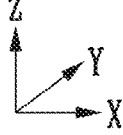
FIG. 3
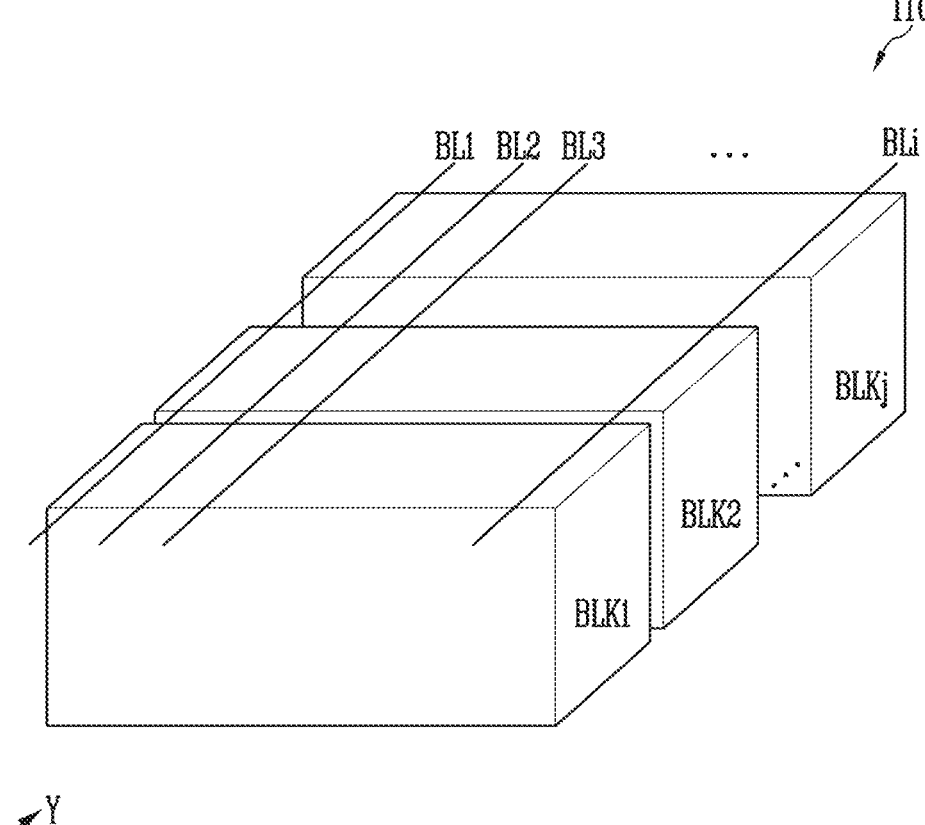

FIG. 4
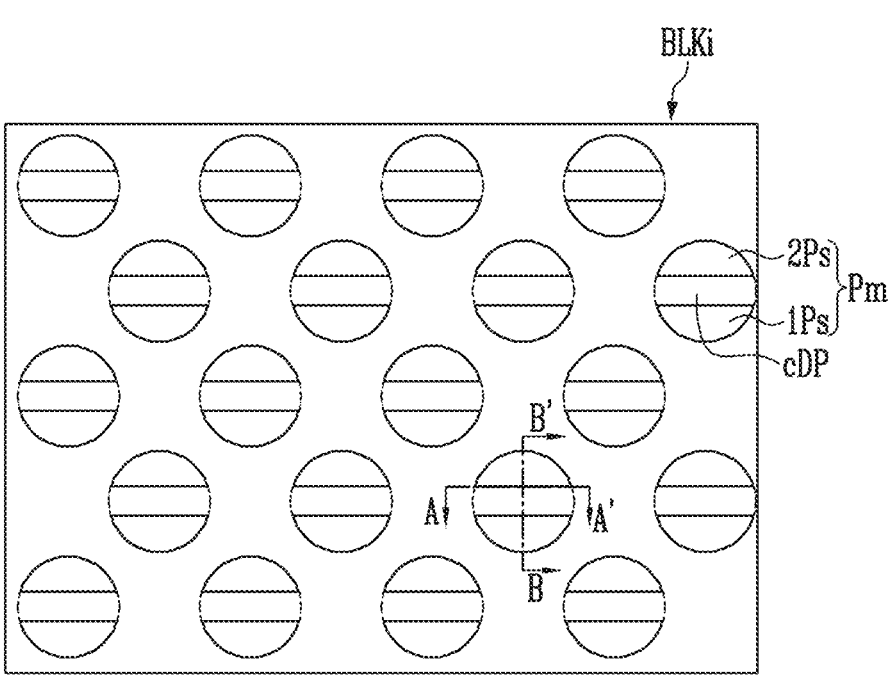
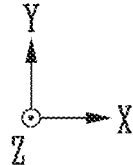

FIG. 11
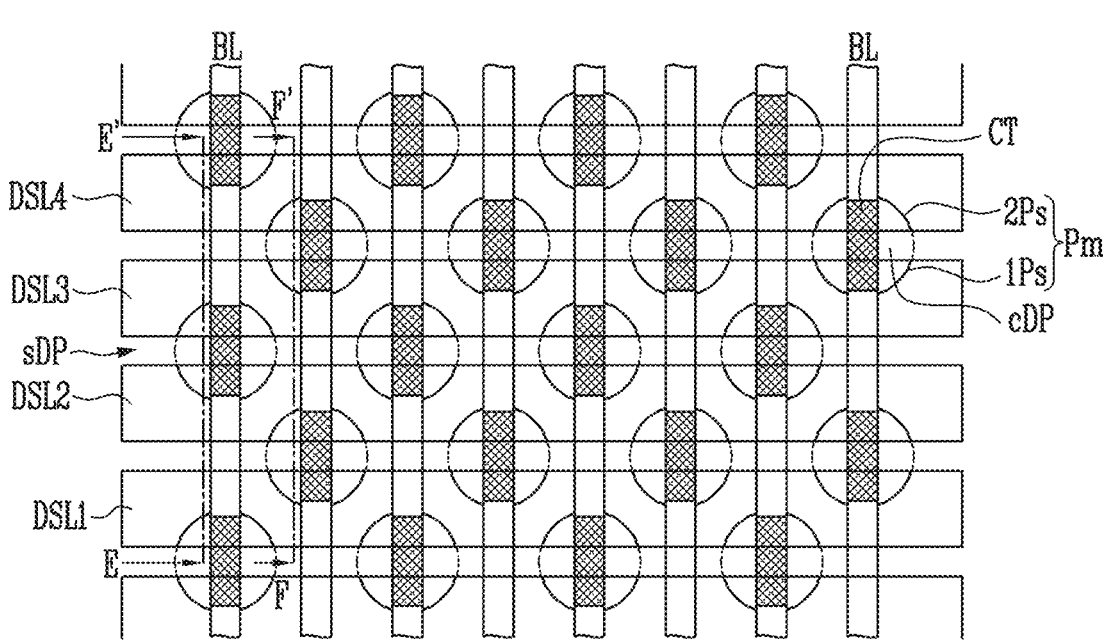
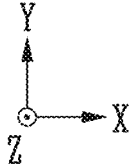
FIG. 12
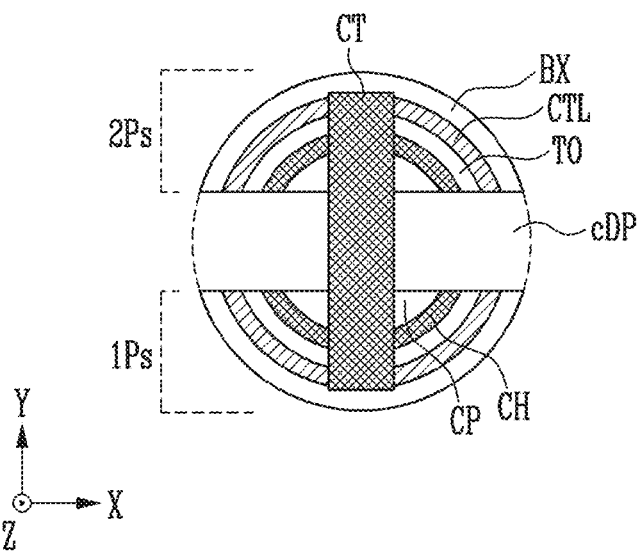

FIG. 16

|  | | 3VG | | | | 4VG | |
| 1MCG \ 2MCG | EV | PV1 | PV2 | PV3 | PV4 (Pv) | PV5 |
|---|---|---|---|---|---|---|
| EV | 11111 (31) | 11101 (29) | 10101 (21) | 10111 (23) | 00011 (03) | None |
| PV1 | 11110 (30) | 11100 (28) | 10100 (20) | 10110 (22) | 00010 (02) | None |
| PV2 | 11010 (26) | 11000 (24) | 10000 (16) | 10010 (18) | 00110 (06) | 00100 (04) |
| PV3 (Pv) | 11011 (27) | 11001 (25) | 10001 (17) | 10011 (19) | 00111 (07) | 00101 (05) |
| PV4 | None | 00001 (01) | 01001 (09) | 01011 (11) | 01111 (15) | 01101 (13) |
| PV5 | None | 00000 (00) | 01000 (08) | 01010 (10) | 01110 (14) | 01100 (12) |

(1VG spans EV–PV3 rows, 2VG spans PV4–PV5 rows)

[ ___ ] FIRST DATA CODE(1DC)

[ ___ ] SECOND DATA CODE(2DC)

FIG. 17

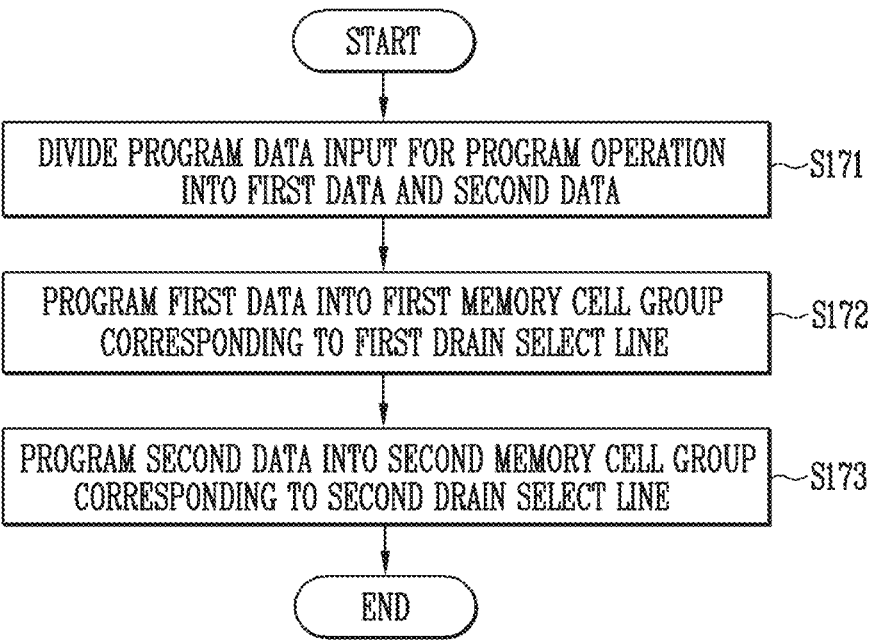

START

DIVIDE PROGRAM DATA INPUT FOR PROGRAM OPERATION INTO FIRST DATA AND SECOND DATA — S171

PROGRAM FIRST DATA INTO FIRST MEMORY CELL GROUP CORRESPONDING TO FIRST DRAIN SELECT LINE — S172

PROGRAM SECOND DATA INTO SECOND MEMORY CELL GROUP CORRESPONDING TO SECOND DRAIN SELECT LINE — S173

END

DESIGN DATA CODE (DC) : 2 - 2 - 2 - 3 - 3

NUMBER OF READ VOLTAGES USED IN READ OPERATION OF 1LD

NUMBER OF READ VOLTAGES USED IN READ OPERATION OF 2LD

NUMBER OF READ VOLTAGES USED IN READ OPERATION OF 3LD

NUMBER OF READ VOLTAGES USED IN READ OPERATION OF 4LD

NUMBER OF READ VOLTAGES USED IN READ OPERATION OF 5LD

FIG. 21

| 1MCG ＼ 2MCG | EV | PV1 | PV2 | PV3 | PV4 (Pv) | PV5 |
|---|---|---|---|---|---|---|
| EV | 11111 (31) | 11101(29) | 10101 (21) | 10111 (23) | None | None |
| PV1 | 11110(30) | 11100 (28) | 10100(20) | 10110(22) | 00010(02) | 00011(03) |
| PV2 | 11010(26) | 11000 (24) | 10000(16) | 10010(18) | 00110 (06) | 00100(04) |
| PV3 (Pr) | 11011(27) | 11001 (25) | 10001(17) | 10011(19) | 00111 (07) | 00101 (05) |
| PV4 | None | 00001(01) | 01001(09) | 01011(11) | 01111 (15) | 01101 (13) |
| PV5 | None | 00000(00) | 01000(08) | 01010(10) | 01110 (14) | 01100 (12) |

[ - - - - - - - ] FIRST DATA CODE

[ ＿＿＿＿＿＿ ] SECOND DATA CODE

FIG. 22

| 1MCG \ 2MCG | EV | PV1 | ... | PVm | PV(m+1) | ... | PVn |
|---|---|---|---|---|---|---|---|
| EV | | | | | None | ... | None |
| PV1 | | | | | | | |
| ⋮ | | | | | | | |
| PVm | | | | | | | |
| PV(m+1) | None | | | | | | |
| ⋮ | ⋮ | | | | | | |
| PVn | None | | | | | | |

3VG (EV through PVm columns) · 4VG (PV(m+1) through PVn columns)

1VG (EV through PVm rows) · 2VG (PV(m+1) through PVn rows)

▢ FIRST DATA CODE

▢ SECOND DATA CODE

OPERATING METHOD OF MEMORY DEVICE

CROSS-REFERENCE TO RELATED APPLICATION

The present application claims priority under 35 U.S.C. § 119(a) to Korean patent application number 10-2023-0185884 filed on Dec. 19, 2023, in the Korean Intellectual Property Office, the entirety of which application is incorporated herein by reference.

BACKGROUND

1. Technical Field

Various embodiments of the present disclosure relate generally to a memory device, including but not limited to a memory device having a three-dimensional structure and a method of operating the memory device.

2. Related Art

Memory devices are classified as a volatile memory device that loses or does not retain the stored data when power is not supplied or a non-volatile memory device that retains the stored data even when power is not supplied.

A non-volatile memory device includes NAND flash memory, NOR flash memory, resistive random access memory (ReRAM), phase-change random access memory (PRAM), magnetoresistive random access memory (MRAM), ferroelectric random access memory (FRAM), and spin transfer torque random access memory (STT-RAM).

Memory cells included in NAND flash memory, among these memories, are coupled between word lines and bit lines and are programmed or read when voltages are applied to the word lines and the bit lines.

A memory device that has a three-dimensional structure includes memory cells that are stacked on a substrate. For example, when the substrate forms a plane in the X and Y directions, the memory cells are stacked on the substrate in a Z direction, and the memory cells stacked in the Z direction are also arranged in the X and Y directions.

Along with the increase in integration density of a memory device, the size of each of the memory cells is reduced and the spacing between the memory cells is reduced accordingly. As a result, the memory cells often interfere with each other in the X, Y, and Z directions. In addition, as the number of bits of data stored in the memory device increases, intervals between threshold voltages of the memory cells narrows. When the decrease in the intervals between the threshold voltages causes different threshold voltages to overlap or coincide with each other, the reliability of a read operation of the memory cells deteriorates.

SUMMARY

According to an embodiment, a method of operating a memory device may include programming program data by distributing the program data to a first memory cell group corresponding to a first drain select line and a second memory cell group corresponding to a second drain select line during a program operation of a selected memory block, reading memory cells included in each of the first memory cell group and the second memory cell group during a read operation of the selected memory block, and determining threshold voltages for the first memory cell group according to a read result for the first memory cell group and threshold voltages for the second memory cell group according to a read result for the second memory cell group and outputting data codes corresponding to combinations of the threshold voltages during a read operation of the selected memory block.

According to an embodiment, a method of operating a memory device may include programming M bits of data into memory cells selected by select lines, where M is a real number, reading the memory cells according to each of the select lines, and outputting data codes by combining read results of the memory cells corresponding to each of the select lines, wherein each of the data codes comprises N bits, and N is greater than M.

According to an embodiment, a method of operating a memory device may include identifying first threshold voltages corresponding to a first memory cell group and second threshold voltages corresponding to a second memory cell group, generating first data codes by combining threshold voltages, among the first and second threshold voltages, included between a minimum threshold voltage and a reference threshold voltage, generating second data codes by combining threshold voltages, among the first and second threshold voltages, included between a threshold voltage greater than the reference threshold voltage and a maximum threshold voltage, excluding codes for inactive combinations of threshold voltages, which inactive combinations have voltage differences greater than a reference voltage from the second data codes, determining read voltages according to a quantity of bits stored in each of memory cells included in the first memory cell group and the second memory cell group and performing a first read operation on the first memory cell group and a second read operation on the second memory cell group by using the read voltages, and outputting a selected data code among the first data codes and the second data codes by combining read results from the first read operation and the second read operation.

According to an embodiment, a method may include differentiating data corresponding to different drain select lines; identifying first threshold voltages corresponding to a first memory cell group and second threshold voltages corresponding to a second memory cell group; generate data codes according to the first threshold voltages and the second threshold voltages corresponding to the differentiates data; and outputting a data code among the data codes.

BRIEF DESCRIPTION OF THE DRAWINGS

FIG. 2 is a diagram illustrating arrangement of a memory cell array and a peripheral circuit;

FIG. 3 is a diagram illustrating the structure of a memory cell array according to an embodiment;

FIG. 4 is a plan view illustrating the structure of a memory block according to an embodiment;

FIG. 11 is a plan view illustrating the structure of a memory block according to an embodiment;

FIG. 12 is a plan view illustrating the structure of sub-plugs according to an embodiment;

FIG. 16 is table including data codes according to an embodiment;

FIG. 17 is a flowchart illustrating a program operation according to an embodiment of the present disclosure;

FIG. 21 is table including data codes according to an embodiment of the present disclosure;

FIG. 22 is a table including data codes according to an embodiment of the present disclosure;

DETAILED DESCRIPTION

Specific structural or functional descriptions of embodiments are provided as examples to describe concepts that are disclosed in the present application. Examples or embodiments in accordance with the concepts may be carried out in various forms, and the descriptions are not limited to the examples or embodiments described in this specification. Terms such as "top," "under," "over," "upper," "lower," "right," "left," "column," "row," and other terms implying spatial relationship are utilized only for the purpose of ease of description or reference to a drawing and are not otherwise limiting.

Figure 1:
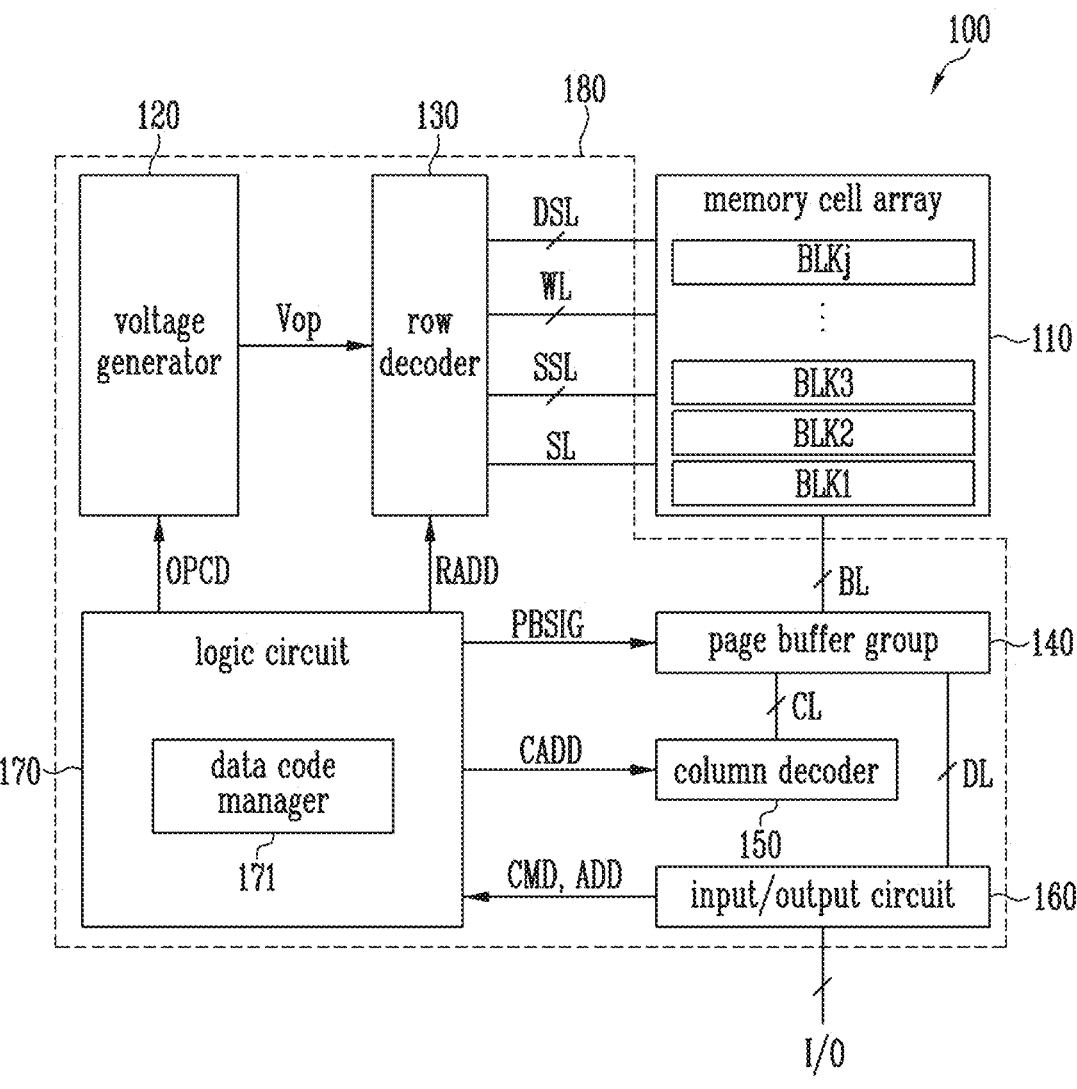
FIG. 1 is a diagram illustrating a memory device according to an embodiment of the present disclosure.

FIG. 1 is a diagram illustrating a memory device 100 according to an embodiment of the present disclosure.

Referring to FIG. 1, the memory device 100 includes a memory cell array 110 and a peripheral circuit 180.

The memory cell array 110 includes a plurality of memory blocks, including a first memory block BLK1 to a jth memory block BLKj. Each of the memory blocks BLK1 to BLKj includes memory cells that store data. Drain select lines DSL, word lines WL, source select lines SSL, and a source line SL are coupled to each of the memory blocks BLK1 to BLKj, and bit lines BL are commonly coupled to the memory blocks BLK1 to BLKj.

The memory blocks BLK1 to BLKj are formed having a three-dimensional structure. The three-dimensionally structured memory blocks include memory cells that are stacked in a perpendicular direction to a substrate.

Each of the memory cells includes 1-bit data or two or more bits of data according to a program method. For example, a method including storing one bit in one memory cell is referred to as a single-level cell method, and a method including storing two bits of data is referred to as a multi-level cell. A method including storing three bits of data in a single memory cell is referred to as a triple-level cell method. A method including storing four bits of data is referred to as a quad level cell method. Five or more bits of data may be stored in one memory cell.

The peripheral circuit 180 is configured to perform a program operation that stores data in the memory cell array 110, a read operation that outputs data stored in the memory cell array 110, and an erase operation that erases data stored in the memory cell array 110. For example, the peripheral circuit 180 includes a voltage generator 120, a row decoder 130, a page buffer group 140, a column decoder 150, an input/output circuit 160, and a logic circuit 170.

The voltage generator 120 generates various operating voltages Vop that are utilized to perform any of a program operation, a read operation, and an erase operation in response to an operating code OPCD. For example, the voltage generator 120 is configured to generate program voltages, turn-on voltages, turn-off voltages, negative voltages, precharge voltages, verify voltages, read voltages, pass voltages, and erase voltages in response to the operating code OPCD. The operating voltages Vop generated by the voltage generator 120 are applied to the drain select lines DSL, the word lines WL, the source select lines SSL, and the source line SL of a selected memory block by the row decoder 130.

Program voltages are applied to a selected word line, among the word lines WL, during a program operation and are used to increase threshold voltages of memory cells coupled to the selected word line. Turn-on voltages are applied to the drain select lines DSL and the source select lines SSL and are used to turn on drain select transistors and source select transistors. Turn-off voltages are applied to the drain select lines DSL and the source select lines SSL and are used to turn off the drain select transistors and the source select transistors. For example, a turn-off voltage may be 0 V. Precharge voltages may be greater than 0 V and are applied to bit lines during a read operation. Verify voltages are used during a verify operation including determining whether threshold voltages of selected memory cells are increased to a target level. The verify voltages may be at various levels depending on the target level and are applied to the selected word line.

Read voltages are applied to the selected word line during a read operation of selected memory cells. For example, the read voltages may be determined at various levels according to a program method of the selected memory cells. Pass voltages are applied to unselected word lines during the program or read operation and are used to turn on memory cells coupled to the unselected word lines.

Erase voltages are used during an erase operation that erases memory cells included in the selected memory block and are applied to the source line SL.

The row decoder 130 is configured to apply the operating voltages Vop to the drain select lines DSL, the word lines WL, the source select lines SSL, and the source line SL, each of which are coupled to the memory block selected by a row address RADD. For example, the row decoder 130 is coupled to the voltage generator 120 through global lines and is coupled to the memory blocks BLK1 to BLKj through the drain select lines DSL, the word lines WL, the source select lines SSL, and source line SL. The row decoder 130 selects the drain select lines DSL coupled to the memory block selected by the row address RADD at the same time or different times.

The page buffer group 140 includes a plurality of page buffers (not shown) that are coupled to the memory blocks BLK1 to BLKj, respectively. The page buffers are coupled to the memory blocks BLK1 to BLKj through corresponding bit lines BL. During a read operation, each of the page buffers, in response to page buffer control signals PBSIG, senses currents or voltages of bit lines, which currents or voltages vary depending on threshold voltages of selected memory cells and temporarily store sensed data. The page buffer group 140 transfers data DATA sensed from the selected memory cells to the logic circuit 170 or receives the data DATA from the logic circuit 170 during a read operation. The page buffer group 140 transfers the data DATA received from the logic circuit 170 to the input/output circuit 160 through data lines DL.

The column decoder 150 is configured to transfer data between the page buffer group 140 and the input/output circuit 160 in response to a column address CADD. For example, the column decoder 150 is coupled to the page buffer group 140 through column lines CL and transfers enable signals through the column lines CL. The page buffers included in the page buffer group 140 receive or output data through data lines DL in response to the enable signals.

The input/output circuit 160 is configured to transfer and receive a command CMD, an address ADD and the data DATA through input/output lines I/O. For example, the input/output circuit 160 transfers the command CMD and the address ADD, which are received from an external controller through the input/output lines I/O to the logic circuit 170 and transfers the data, which is received from the external controller through the input/output lines I/O, to the page buffer group 140. Alternatively, the input/output circuit 160 outputs the data, which is transferred from the page buffer group 140, to the external controller through the input/output lines I/O.

The logic circuit 170 outputs the operating code OPCD, the row address RADD, the page buffer control signals PBSIG, and the column address CADD in response to receiving the command CMD and the address ADD. For example, when the command CMD that is input to the logic circuit 170 corresponds to a program operation, the logic circuit 170 controls devices, which are included in the peripheral circuit 180, to perform a program operation for the memory block selected by the address ADD. For example, when the command CMD that is input to the logic circuit 170 corresponds to a read operation, the logic circuit 170 controls the devices that are included in the peripheral circuit 180 to perform the read operation for the memory block selected by the address ADD and output the read data. When the command CMD, which is input to the logic circuit 170, corresponds to an erase operation, the logic circuit 170 controls the devices that are included in the peripheral circuit 180 to perform the erase operation for the memory block selected by the address ADD.

The logic circuit 170 includes a data code manager 171.

The data code manager 171 is configured to generate data codes, also referred to simply as codes herein, according to the data DATA that is transferred from the page buffer group 140 and to transfer the data codes to the page buffer group 140 during a read operation. For example, the data code manager 171 is configured to differentiate data corresponding to different drain select lines, among the data transferred from the page buffer group 140, and generate data codes according to threshold voltages corresponding to the divided data.

The data codes transferred from the data code manager 171 to the page buffer group 140 are transferred to the input/output lines I/O through the drain lines DL. The input/output circuit 160 outputs the data codes through the input/output lines I/O.

FIG. 2 is a diagram illustrating arrangement of the memory cell array 110 and a peripheral circuit 190.

Referring to FIG. 2, the memory cell array 110 is stacked over or on the peripheral circuit 190. For example, when a substrate is formed in an X-Y plane, the peripheral circuit 180 is stacked in a Z direction from the substrate, and the memory cell array 110 is stacked over or on the peripheral circuit 180.

FIG. 3 is a diagram illustrating the structure of the memory cell array 110.

Referring to FIG. 3, the memory cell array 110 includes the memory blocks bLK1 to BLKj, where j is a positive integer. The memory blocks bLK1 to BLKj are spaced apart from each other in a Y direction and are coupled commonly to a first bit line BL1 to an ith bit lines BLi. For example, the bit lines BL1 to BLi extend in the Y direction and are spaced apart from each other in the X direction. The memory blocks BLK1 to BLKj include main plugs (not shown in FIG. 3) that extend in the Z direction. The main plugs include a plurality of memory cells that store data.

FIG. 4 is a plan view illustrating the structure of a memory block BLKi.

Referring to FIG. 4, the memory block BLKi includes a plurality of main plugs Pm. The main plugs Pm are spaced apart from each other in the X direction and the Y direction and have a cylindrical shape extending in the Z direction. Each of the main plugs Pm includes a first sub-plug 1Ps spaced apart from a second sub-plug 2Ps in the Y direction. The first sub-plug 1Ps and the second sub-plug 2Ps are separated from each other by a channel isolation pattern cDP as shown in the example of FIG. 4. Therefore, the memory cells included in each main plug Pm are separated into memory cells included in the first sub-plug 1Ps and memory cells included in the second sub-plug 2Ps. The memory cells included in the first sub-plug 1Ps store data independently of the memory cells included in the second sub-plug 2Ps. The sub-plugs 1Ps and 2Ps as shown in FIG. 4 are described in more detail with reference to FIG. 5.

Figure 5:
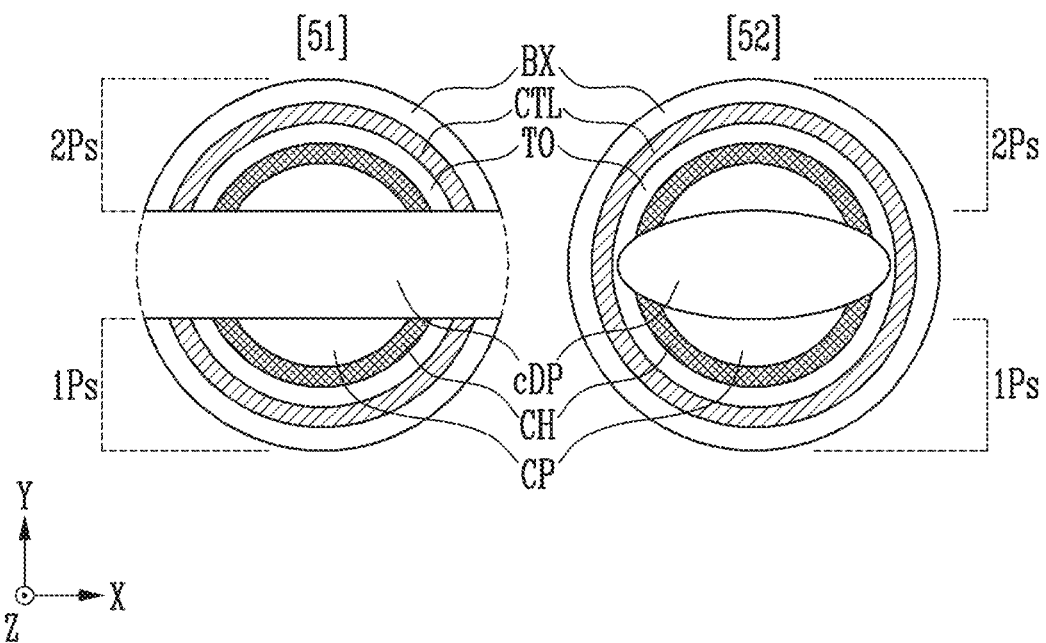
FIG. 5 is a plan view illustrating the structure of sub-plugs according to an embodiment.

FIG. 5 is a plan view illustrating the structure of the first sub-plugs 1Ps and the second sub-plugs 2Ps.

Referring to FIG. 5, the first sub-plug 1Ps and the second sub-plug 2Ps include a core pillar CP, a channel layer CH, a tunnel isolation layer TO, a charge trap layer CTL, and a blocking layer BX that are symmetrical about the channel isolation pattern cDP. The surface of the first sub-plug 1Ps that is adjacent to the channel isolation pattern cDP faces the surface of the second sub-plug 2Ps that is adjacent to the channel isolation pattern cDP. The core pillar CP is formed in the center of the sub-plugs 1Ps and 2Ps and includes an insulating material. The channel layer CH refers to a layer in which electrons or holes are moved. The channel layer CH may have a cylindrical shape surrounding the core pillar CP and may include a silicon layer, a doped silicon layer, or a polysilicon layer. The tunnel isolation layer TO is provided to prevent movement of electrons between the channel layer CH and the charge trap layer CTL. The tunnel isolation layer TO may have a cylindrical shape surrounding the channel layer CH and includes an insulating material. For example, the tunnel isolation layer TO may include an oxide layer or a silicon oxide layer. The charge trap layer CTL is provided to trap electrons. The charge trap layer CT may have a cylindrical shape surrounding the tunnel isolation layer TO and may include a nitride layer. The blocking layer BX electrically insulates the charge trap layer CT from a gate line external to the sub-plugs 1Ps and 2Ps (not shown). The blocking layer BX may have a cylindrical shape surrounding the charge trap layer CT and include an insulating material. For example, the blocking layer BX may include an oxide layer or a silicon oxide layer.

The sub-plugs 1Ps and 2Ps may have various shapes depending on the shape of the channel isolation pattern cDP. For example, the core pillar CP, the channel layer CH, the tunnel isolation layer TO, the charge trap layer CTL, and the blocking layer BX may be separated by the channel isolation pattern cDP to thereby form a main plug PM 51 including the sub-plugs 1Ps and 2Ps. Alternatively, a main plug PM 52 may be formed where only the core pillar CP the channel layer CH are separated between the first sub-plug 1Ps and the second sub-plug 2Ps and the tunnel isolation layer TO, the charge trap layer CTL, and the blocking layer BX are commonly coupled to each of the first sub-plug 1Ps and the second sub-plug 1Ps. Thus, the sub-plugs 1Ps and 2Ps may be described depending on the separation structure of the channel layer CH. For example, alternatively to the structures shown in FIG. 5, the sub-plugs 1Ps and 2Ps may have a structure in which the core pillar CP, the channel layer CH, and the tunnel isolation layer TO are separated by the channel isolation pattern cDP or a structure in which the core pillar CP, the channel layer CH, the tunnel isolation layer TO, and the charge trap layer CTL are separated by the channel isolation pattern cDP. Although FIG. 5 illustrates that the channel isolation pattern cDP extends in the X direction, the channel isolation pattern cDP may extend in the Y direction, or in any direction between the X direction and the Y direction. Each of the memory cells included in the sub-plugs 1Ps and 2Ps with the channel layer CH separated by the channel isolation pattern cDP separately store data.

Figure 6:
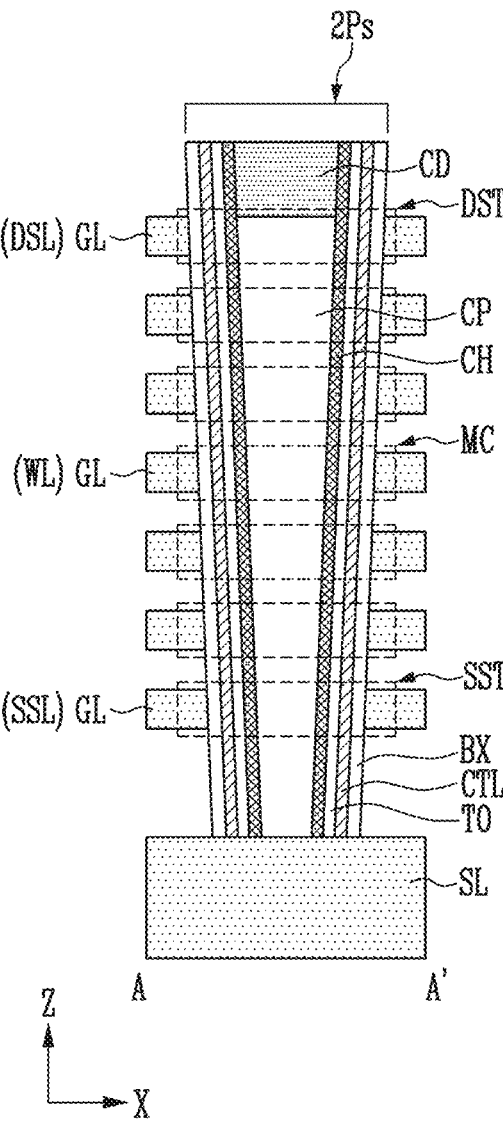
FIG. 6 is a cross-sectional diagram illustrating the structure of a sub-plug taken along line A-A' of FIG. 4 according to an embodiment.

FIG. 6 is a cross-sectional diagram illustrating the structure of a sub-plug taken along line A-A' of FIG. 4.

Referring to FIG. 6, a plurality of gate lines GL and the source line SL are stacked and spaced apart from each other, and the second sub-plug 2Ps passes through the plurality of gate lines GL in the Z direction. The plurality of gate lines GL includes the source select line SSL, the word lines WL, and the drain select line DSL. The source select line SSL is coupled to a gate of a source select transistor SST. Each of the word lines WL is coupled to one of the gates of the memory cells MC. The drain select line DSL is coupled to a gate of a drain select transistor DST. The source select transistor SST electrically blocks or couples the source line SL and the memory cells MC. The drain select transistor DST electrically blocks or couples the bit line BL and memory cells MC. The source line SL contacts a lower portion of the channel layer CH and the bit line BL contacts an upper portion of the channel layer CH. Depending on the configuration of the memory device, the bit line BL may be arranged under the channel layer CH, and the source line SL may be arranged on top of the channel layer CH. A conductive layer CD for improving the electrical characteristics of the drain select transistor DST may be formed on top of the core pillar CP.

Figure 7:
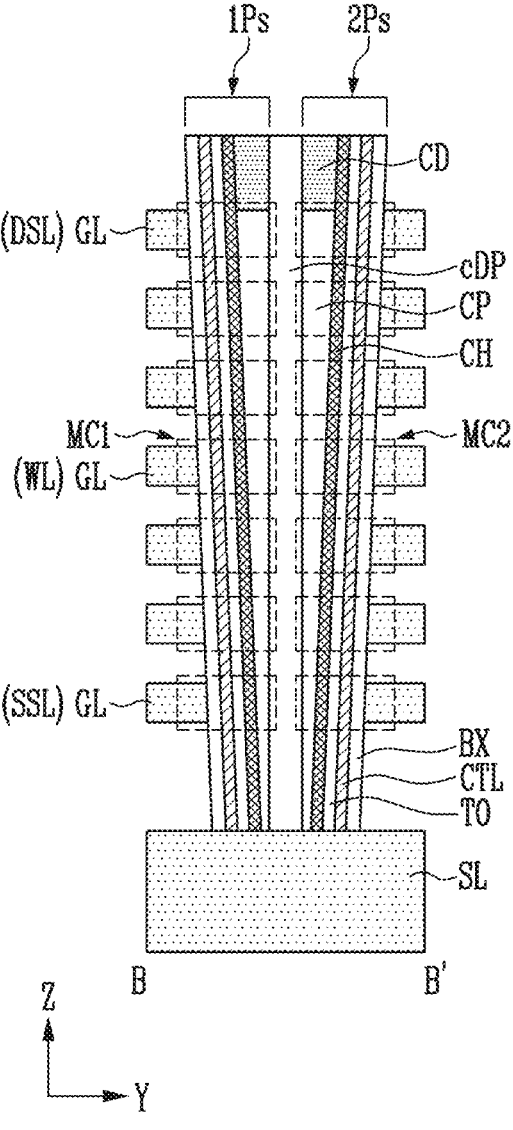
FIG. 7 is a cross-sectional diagram illustrating the structure of sub-plugs taken along line B-B' of FIG. 4 according to an embodiment.

FIG. 7 is a cross-sectional diagram illustrating the structure of sub-plugs taken along line B-B' of FIG. 4.

Referring to FIG. 7, the channel isolation pattern cDP is formed between the first sub-plug 1Ps and the second sub-plugs 2Ps. The channel isolation pattern cDP separates the channel layer CH included in the sub-plugs 1Ps and 2Ps and separates the first sub-plug 1Ps and the second sub-plug 2Ps in the Z direction. The channel isolation pattern cDP separates the channel layer CH, but does not separate the gate lines GL. Memory cells coupled to the same word line WL are separated by the channel isolation pattern cDP. For example, memory cells coupled to the same word line WL are separated by the channel isolation pattern cDP into memory cells MC1 included in the first sub-plug 1Ps and memory cells MC2 included in the second sub-plug 2Ps.

Figure 8:
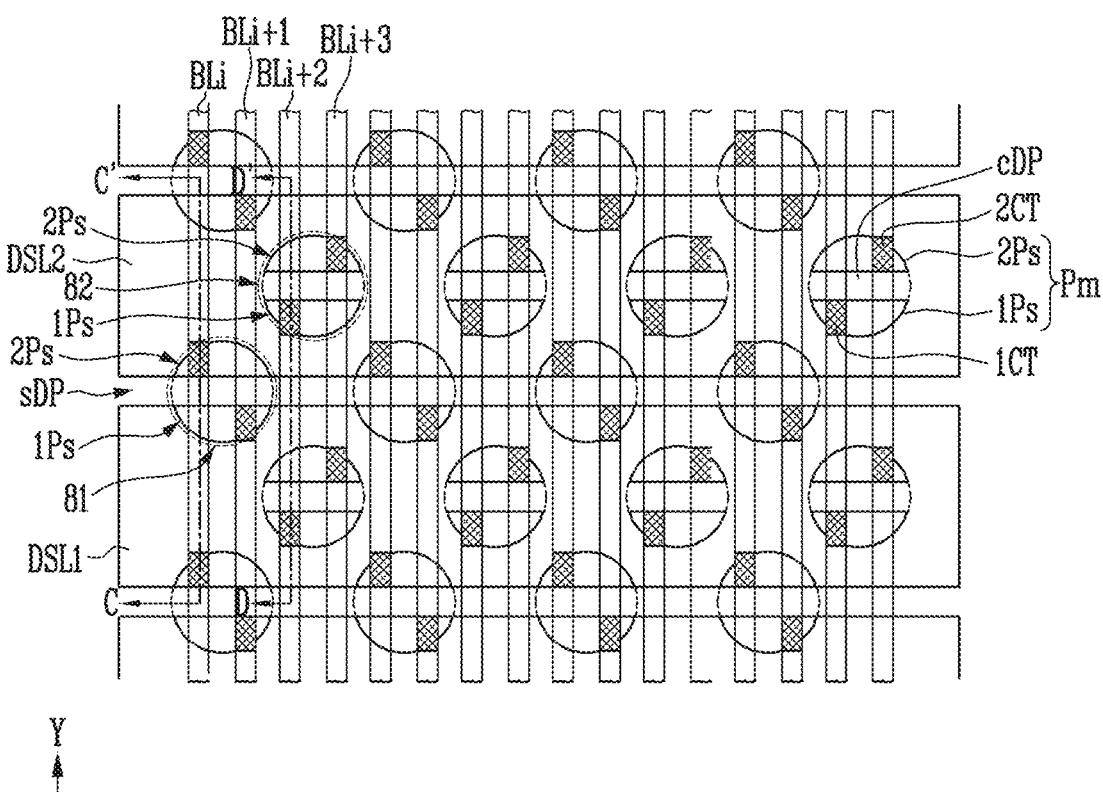
FIG. 8 is a plan view illustrating the structure of a memory block according to an embodiment.

FIG. 8 is a plan view illustrating the structure of a memory block according to an embodiment.

Referring to FIG. 8, the first sub-plugs 1Ps are electrically coupled to the bit lines BL by first contacts 1CT, and the second sub-plugs 2Ps are electrically coupled to the bit lines BL by second contacts 2CT. The first sub-plug 1Ps and the second sub-plug 2Ps included in the same main plug Pm are coupled to different bit lines BL by the first contact 1CT and the second contact 2CT, respectively. For example, the first sub-plugs 1Ps that are arranged in the Y direction in a first column are coupled to ith bit line BLi by the first contacts 1CT, and the second sub-plugs 2Ps that are arranged in the Y direction in a second column are coupled to (i+1) bit line BLi+1 by the second contacts 2CT.

To increase the distance between contacts coupled to main plugs Pm that are adjacent to each other in a diagonal direction, the contacts coupled to the main plugs are arranged in different directions or orientations. For example, as shown in FIG. 8, a main plug Pm 81 that includes a first sub-plug 1Ps coupled to the ith bit line BLi by a first contact 1CT and a second sub-plug 2Ps coupled to the (i+1) bit line BLi+1 by the second contact 2CT is located in a first column of main plugs Pm, where the first contact 1CT and the second contact are in a first orientation aligned along a first diagonal direction across opposite parts of the main plug Pm 81. Also as shown in FIG. 8, a main plug Pm 82 that includes a second sub-plug 2Ps coupled to an (i+2) bit line BLi+2 by a second contact 2CT and a first sub-plug 1Ps coupled to an (i+3) bit line BLi+3 by a first contact 1CT is located in a second column of main plugs PM consecutive to the first column of main plugs PM in which the main plug Pm 81 is located, where the first contact 1CT and the second contact 2CT of the main plug Pm 82 are in a second orientation aligned along a second diagonal direction across opposite parts of the main plug Pm 82. In the example of FIG. 8, the first diagonal direction is perpendicular to or 90 degrees offset from the second diagonal direction. In this example, the first diagonal direction is 315 degrees from the X axis and the second diagonal direction is 45 degrees from the X axis. Other directions and other orientations of contacts 1CT and 2CT may also be utilized. Odd numbered columns utilize the first diagonal direction/orientation and even numbered columns utilize the second diagonal direction/orientation, such that consecutive columns of main plugs utilize different directions/orientations to increase the distance between contacts of consecutive main plugs Pm.

A drain select line may be separated in the Y direction and extend in the X direction. For example, a first drain select line DSL1 and a second drain select line DSL2 are separated by a selected isolation pattern sDP that extends in the X direction as shown in FIG. 8. In some main plugs Pm, such as main plug Pm 81, the first sub-plug 1Ps is coupled to a different drain select line than the drain select line coupled to the second sub-plug 2Ps. In other main plugs Pm, such as main plug Pm 82, the sub-plugs 1Ps and 2Ps are coupled to the same drain select line.

For example, the sub-plugs 1Ps and 2Ps included in the main plugs Pm arranged in even-numbered rows in the X direction are coupled to the same drain select line, and the sub-plugs 1Ps and 2Ps of the main plugs Pm in odd-numbered rows in the X direction are coupled to different drain select lines. In this example, consecutive main plugs Pm in a diagonal direction alternate between coupling to the same drain select line and coupling to different drain select lines.

Figure 9:
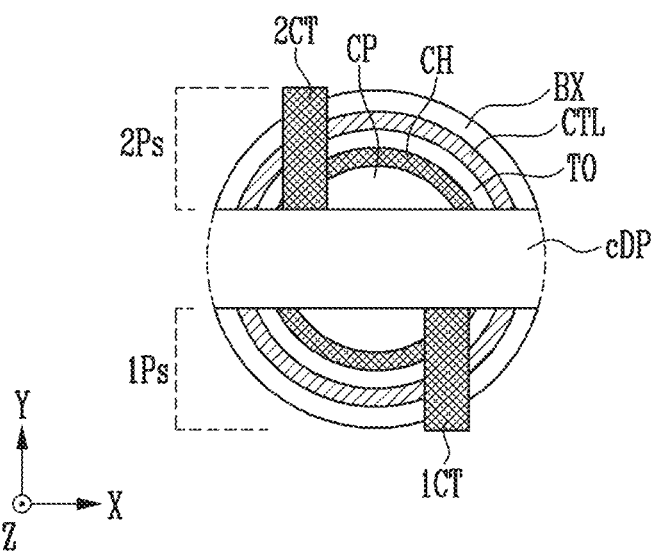
FIG. 9 is a plan view illustrating the structure of a memory block according to an embodiment.
Figure 10A:
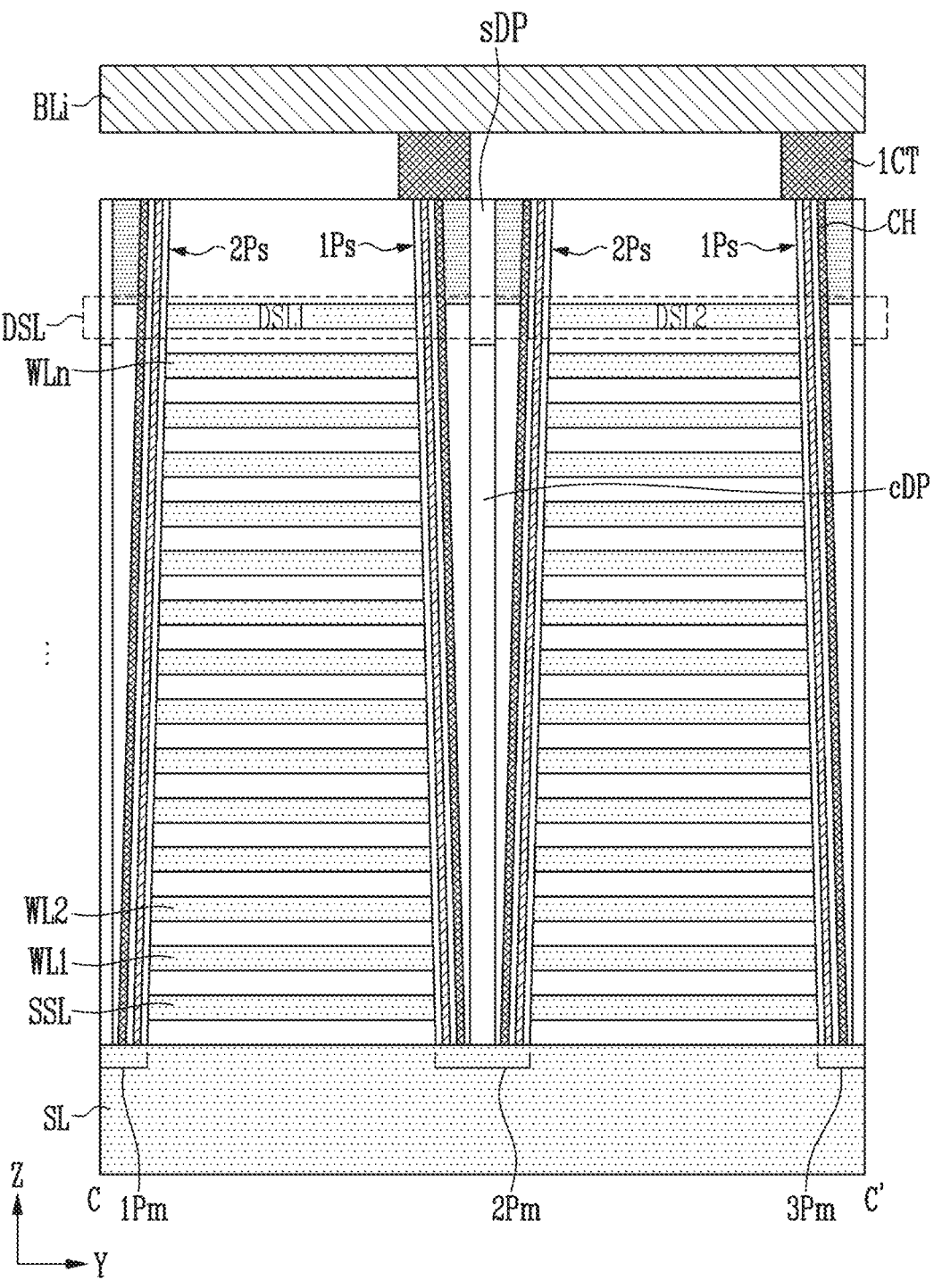
FIG. 10A is a cross-sectional diagram illustrating the structure of a memory block taken along line C-C' of FIG. 8 according to an embodiment.
Figure 10B:
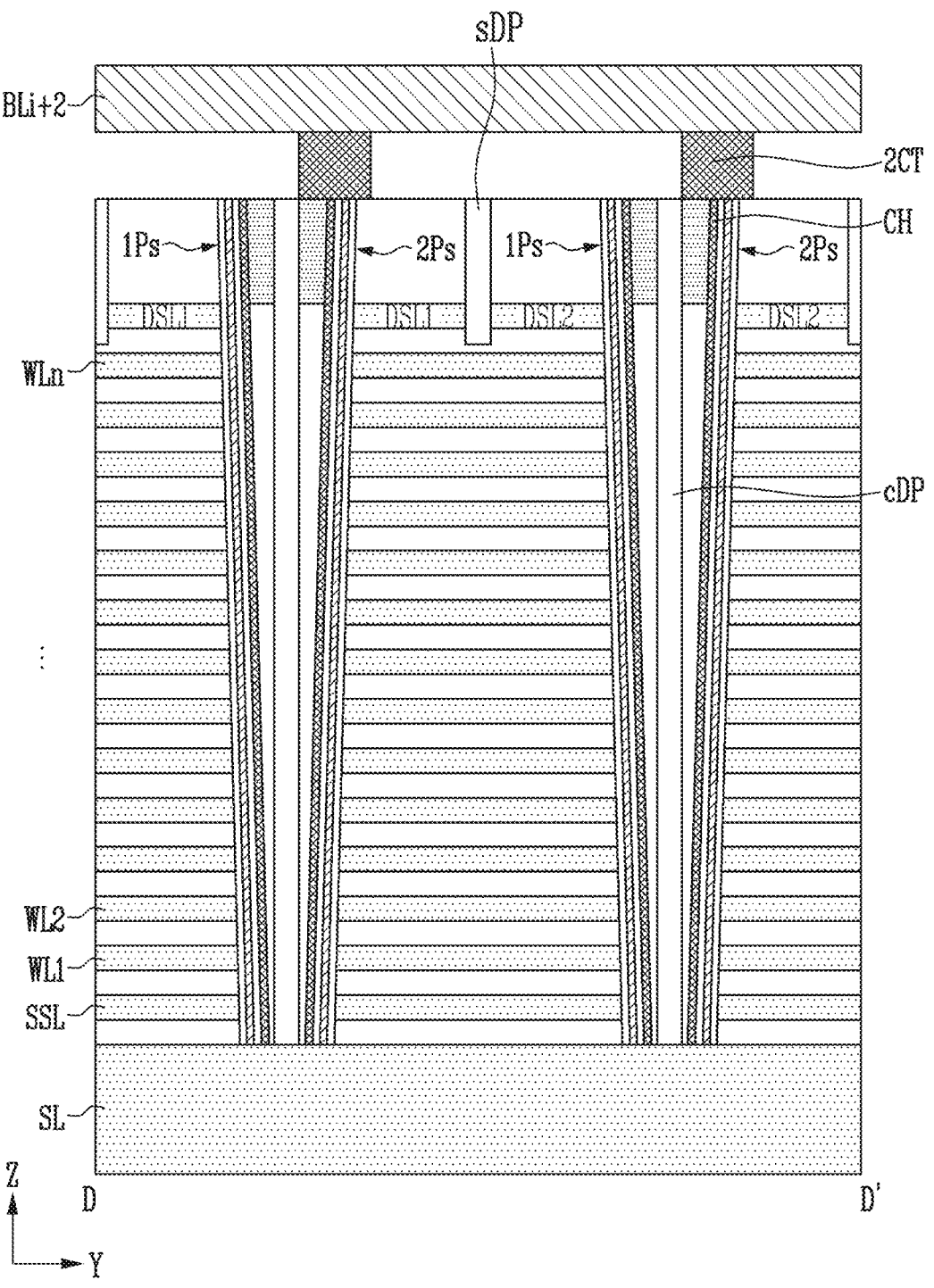
FIG. 10B is a cross-sectional diagram illustrating the structure of a memory block taken along line D-D' of FIG. 8 according to an embodiment.

The structure shown in FIG. 8 is described in more detail with respect to FIG. 9, FIG. 10A, and FIG. 10B.

FIG. 9 is a plan view illustrating the structure of the first sub-plugs 1Ps and the second sub-plugs 2Ps, for example, as shown in FIG. 8. The main plug Pm shown in FIG. 9 may be, for example, the main plug Pm 81 in FIG. 8.

Referring to FIG. 9, the first contact 1CT contacts the channel layer CH included in the first sub-plug 1Ps, and the second contact 2CT contacts the channel layer CH included in the second sub-plug 2Ps. In the structure shown in FIG. 9, in the first orientation of contacts 1CT and 2CT, the first contact 1CT is the contact arranged closest to the right side of the main plug PM and the second contact 2CT is the contact arranged closest to the left side of the main plug PM, such as in the main plug Pm 81 in FIG. 8. In the second orientation of contacts, such as in the main plug 82 of FIG. 8, the first contact 1CT is the contact arranged closest to the left side of the main plug PM and the second contact 2CT is the contact arranged closest to the right side of the main plug PM.

FIG. 10A is a cross-sectional diagram illustrating the structure of the memory block taken along line C-C' of FIG. 8.

Referring to FIG. 10A, the source select line SSL, the first word line WL1 to the nth word line WLn, and the drain select line DSL are spaced apart from each other and stacked on or over the source line SL. Lines that are formed in the same layer, among the source select line SSL and the word lines WL1 to WLn are coupled to each other. When the drain select line DSL is in the same layer, the drain select line DSL is separated into a plurality of drain select lines by the selected isolation pattern SDP. For example, the drain select line DSL is separated into the first select line DSL1 and the second drain select line DSL2 by the selected isolation pattern sDP.

The source select line SSL and the word lines WL1 to WLn are separated by the channel isolation pattern cDP.

In the cross-section taken along line C-C', the first drain select line DSL1 is commonly coupled to the first sub-plugs 1Ps of a first main plug 1Pm and the second sub-plug 2Ps of a second main plug 2Pm, where the first main plug 1Pm and the second main plug 2Pm are different main plugs. In the cross-section taken along line C-C', the second drain select line DSL2 is commonly coupled to the first sub-plugs 1Ps of a third main plug 3Pm and the second sub-plug 2Ps of the second main plug 2Pm, where the where the third main plug 3Pm and the second main plug 2Pm are different main plugs. The first drain select line DSL1 and the second drain select line DSL2 are coupled to the first sub-plug 1Ps and the second sub-plug 2Ps included in the same main plug. The first main plug 1Pm, the second main plug 2Pm, and the third main plug 3Pm are formed in a same column extending in the Y direction, such as the first column shown in FIG. 8.

The first contacts 1CT are formed on the first sub-plugs 1Ps, and the ith bit line BLi is formed on the first contacts 1CT. Therefore, different first sub-plugs 1Ps are commonly coupled to the ith bit line BLi by the first contacts 1CT. The first contacts 1CT are not coupled to the second sub-plugs 2Ps included in the same main plug. Thus, the second sub-plugs 2Ps are not coupled to the ith bit line BLi.

FIG. 10B is a cross-sectional diagram illustrating the structure of the memory block taken along line D-D' of FIG. 8.

Referring to FIG. 10B, the second contacts 2CT are formed on the second sub-plugs 2Ps, and the (i+2) bit line BLi+2 is formed on the second contacts 2CT. In the main plug where the second sub-plugs 2Ps are coupled to the (i+2) bit line BLi+2, the first sub-plugs 1Ps are not coupled to the (i+2) bit line BLi+2.

Because the first drain select line DSL1 is spaced apart from the second drain select line DSL2 by the selected isolation pattern sDP, these drain select lines DSL1 and DSL2 are electrically coupled to each other in an area where the selected isolation pattern sDP is not formed. For example, when the sub-plugs 1Ps and 2Ps of a row of main plugs Pm located between consecutive selected isolation patterns sDP pass through the first drain select line DSL1, the first drain select line DSL1 is not separated by the selected isolation patterns sDP. As a result, the first sub-plug 1Ps and the second sub-plug 2Ps in the row of main plugs Pm are commonly coupled to the first drain select line DSL1.

FIG. 11 is a plan view illustrating the structure of an alternative memory block according to an embodiment.

Figure 13A:
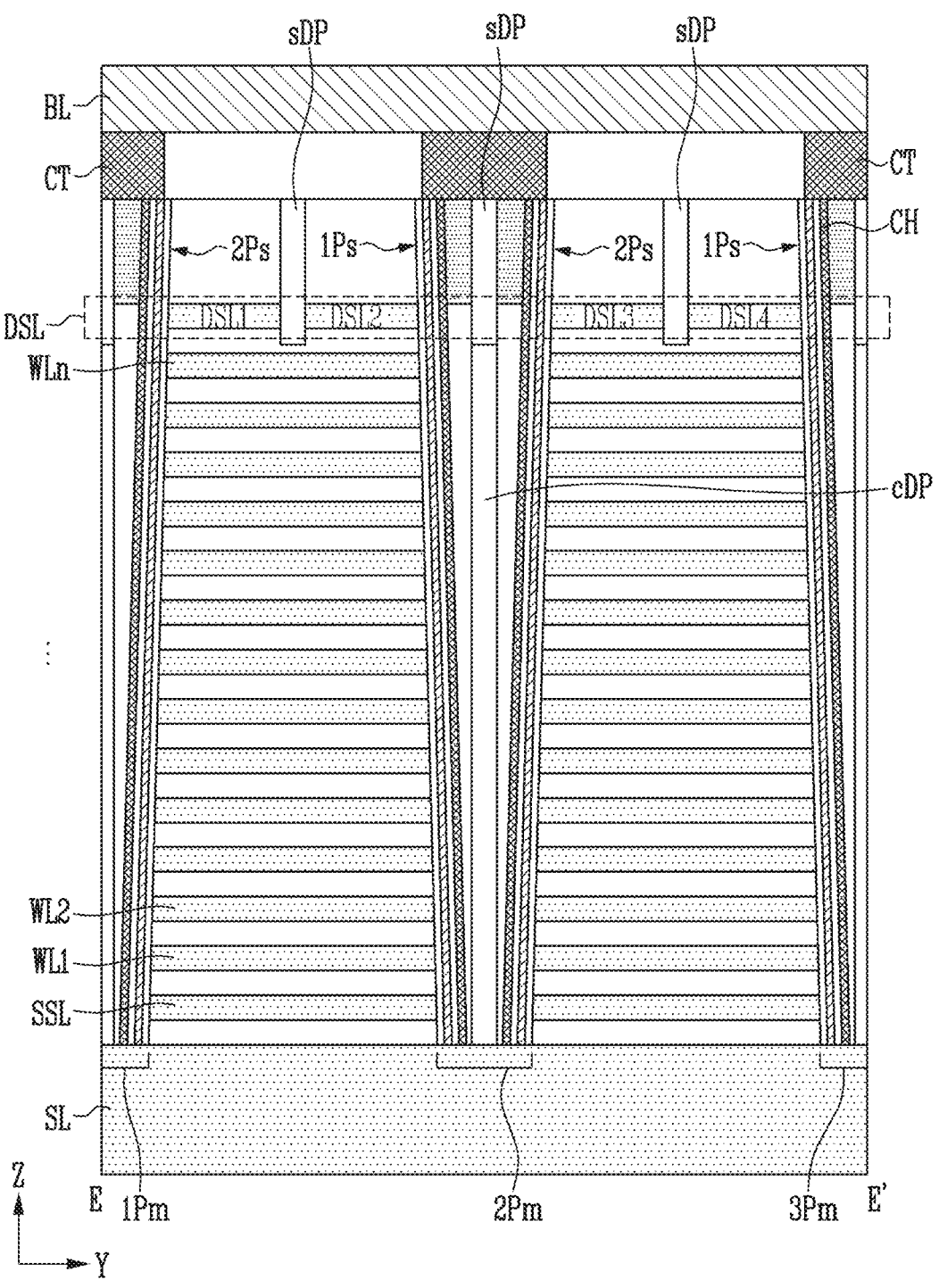
FIG. 13A is a cross-sectional diagram illustrating the structure of a memory block taken along line E-E' of FIG. 11 according to an embodiment.
Figure 13B:
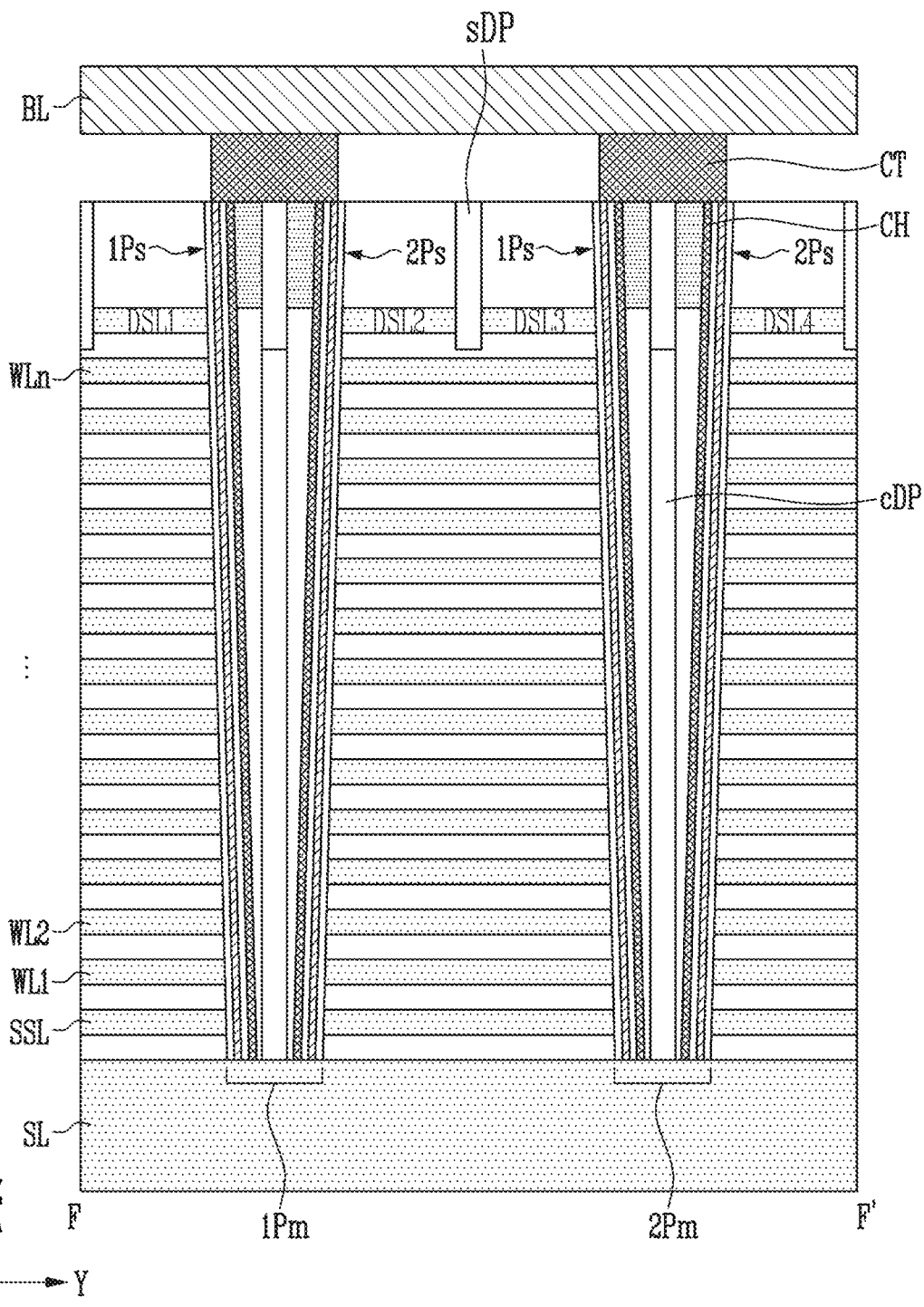
FIG. 13B is a cross-sectional diagram illustrating the structure of a memory block taken along line F-F' of FIG. 11 according to an embodiment.

Referring to FIG. 11, the main plug Pm includes the first sub-plug 1Ps and the second sub-plug 2Ps, which are separated by the channel isolation pattern cDP. A drain select line is commonly coupled to sub-plugs of main plugs Pm that are spaced apart from each other along the X direction, separated from each other in the Y direction, and generally arranged in a diagonally offset or zigzag pattern. For example, the first drain select line DSL1, the second drain select line DSL2, the third drain select line DSL3, and the fourth drain select line DSL4 are spaced apart from each other by the selected isolation patterns sDP that extend in the X direction. The channel isolation patterns CDP of the main plugs Pm are formed to overlap with the selected isolation patterns sDP in the X direction. The channel isolation patterns cDP advantageously align with the selected isolation patterns sDP in the Z direction as shown in FIG. 13A and FIG. 13B.

The bit lines BL extend in the Y direction and are spaced apart from each other in the X direction. The sub-plugs 1Ps and 2Ps of the main plugs Pm that are arranged in a common column the Y direction are commonly coupled to the same bit line BL. The sub-plugs 1Ps and 2Ps of the main plugs Pm that are arranged in a common row in the X direction are coupled to different bit lines BL. The first sub-plug 1Ps and the second sub-plug 2Ps included in the same main plug Pm are commonly coupled to the same bit line BL by the same contact CT such that the first sub-plug 1Ps and the second sub-plug 2Ps included in the same main plug Pm are electrically coupled to the same bit line BL.

FIG. 12 is a plan view illustrating the structure of the first sub-plugs 1Ps and the second sub-plugs 2Ps of a main plug Pm, for example, as shown in FIG. 11.

Referring to FIG. 12, the contact CT commonly contacts the first and second sub-plugs 1Ps and 2Ps. For example, the contact CT is commonly coupled to the channel layer CH included in the first sub-plug 1Ps and the channel layer CH included in the second sub-plug 2Ps.

FIG. 13A is a cross-sectional diagram illustrating the structure of the memory block taken along line E-E' of FIG. 11.

Referring to FIG. 13A, the selected isolation patterns sDP are formed between and through the main plugs Pm. The drain select line DSL formed in the same layer is separated into the first drain select line DSL1, the second drain select line DSL2, the third drain select line DSL3, and the fourth drain select line DSL4 by the selected isolation patterns sDP. When a first main plug 1Pm, a second main plug 2Pm, and a third main plug 3Pm are spaced apart from each other in one column in the Y direction, the second sub-plug 2Ps included in the first main plug 1Pm is coupled to the first drain select line DSL1. The first sub-plug 1Ps included in the second main plug 2Pm is coupled to the second drain select line DSL2. The second sub-plug 2Ps of the second main plug 2Pm is coupled to the third drain select line DSL3. The first sub-plug 1Ps included in the third main plug 3Pm is coupled to the fourth drain select line DSL4. The sub-plugs 1Ps and 2Ps included in each of the main plugs 1Pm to 3Pm are separated from each other by the channel isolation pattern cDP. Each contact CT is formed on the first sub-plug 1Ps and the second sub-plug 2Ps included in the same main plug. The bit line BL is formed on top of the contacts CT. The bit line BL extends in the Y direction is commonly coupled to the first and second sub-plugs 1Ps and 2Ps included in each of the first to third main plugs 1Pm to 3Pm formed in the same column of main plugs Pm.

FIG. 13B is a cross-sectional diagram illustrating the structure of a memory block taken along line F-F' of FIG. 11.

Referring to FIG. 13B, the first main plug 1Pm is formed between the first drain select line DSL1 and the second drain select line DSL2, and the second main plug 2Pm is formed between the third drain select line DSL3 and the fourth drain select line DSL4. For example, the first sub-plug 1Ps included in the first main plug 1Pm contacts the first drain select line DSL1, and the second sub-plug 2Ps of the first main plug 1Pm contacts the second drain select line DSL2. The first sub-plug 1Ps included in the second main plug 2Pm is coupled to the third drain select line DSL3. The second sub-plug 2Ps of the second main plug 2Pm is coupled to the fourth drain select line DSL4. The source select line SSL and the word lines WL1 to WLn are commonly coupled to the main plugs 1Pm and 2Pm. The first main plug 1Pm and the second main plug 2Pm are formed one column in the Y direction, such as the second column in FIG. 11.

A contact CT is formed on the sub-plugs 1Ps and 2Ps included in each of the main plugs 1Pm and 2Pm, in other words, a contact CT is formed on the first main plug 1Pm, and another contact CT is formed on the second main plug 2Pm. The bit line BL is formed on the contacts CT. The bit line BL extending in the Y direction is commonly coupled to sub-plugs 1Ps and 2Ps included in each of the main plugs 1Pm and 2Pm.

Figure 14:
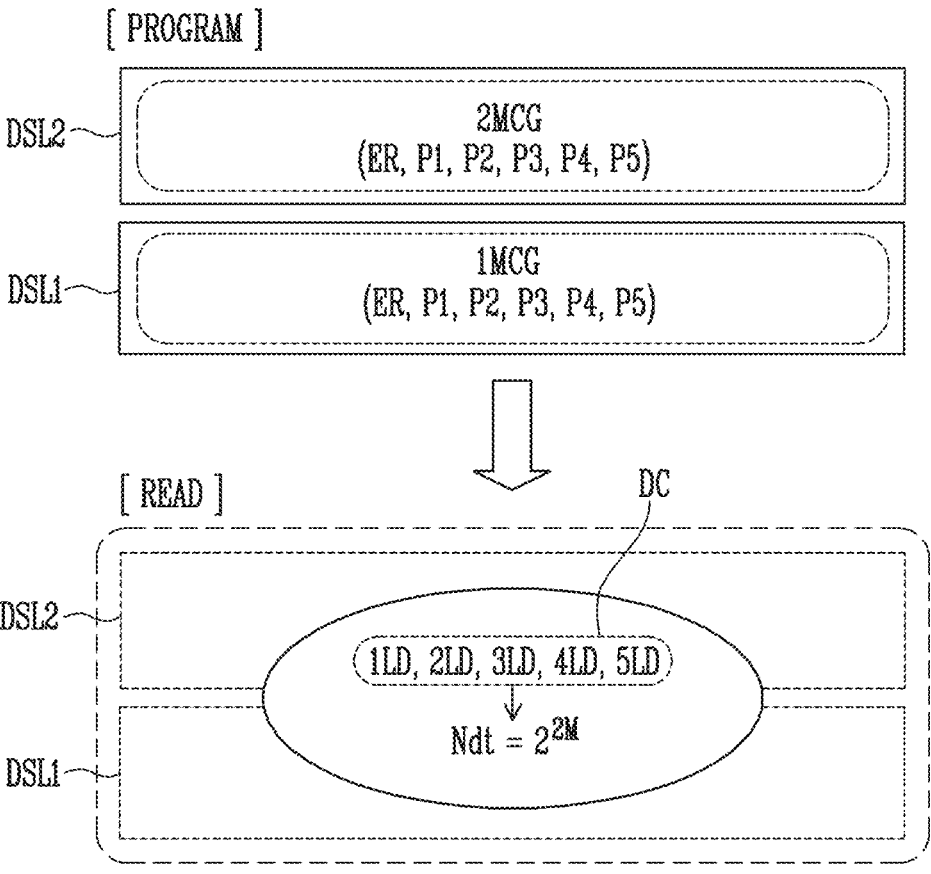
FIG. 14 is a diagram illustrating a program operation and a read operation according to an embodiment of the present disclosure.

FIG. 14 is a diagram illustrating a program operation and a read operation according to an embodiment of the present disclosure.

Referring to FIG. 14, memory cells included in a selected memory block are divided into a first memory cell group 1MCG that is selected by the first drain select line DSL1 and a second memory cell group 2MCG that is selected by the second drain select line DSL2.

In this example, memory cells included in each of the first and second memory cell groups 1MCG and 2MCG are each programmed with 2.5 bits of data. In this example, the memory cells of the memory cell groups 1MCG and 2MCG utilize two raised to the fifth power or 32 threshold voltages. The number 5 in the fifth power refers to the quantity of bits of the memory cells included in each of the memory cell groups 1MCG and 2MCG.

Due to high integration of a memory device, threshold voltage distributions of programmed memory cells in the memory cell groups 1MCG and 2MCG may overlap each other. As a result, errors may occur during a read operation.

In an embodiment, a program operation and a read operation are performed such that the quantity of threshold voltage distributions of memory cells corresponding to a plurality of drain select lines corresponds to a value that is not two raised to the nth power, where n is a positive integer, such as fewer threshold voltage distributions than two raised to an Nth power. For example, during a program operation according to an embodiment, data is distributed and programmed into memory cells corresponding to a plurality of drain select lines. During a read operation according to an embodiment, memory cells corresponding to a plurality of drain select lines are read, data codes DC are generated by combining threshold voltage distributions corresponding to the read data, and the generated data codes DC are output. Through these operations, the reliability of the memory device may be improved.

The program operation and the read operation according to this embodiment are described in more detail.

A program operation of a selected memory block is performed on the memory cells included in each of the first memory cell group 1MCG and the second memory cell group 2MCG. For example, during a program operation that is performed in response to one program command that is input to the logic circuit 170 of FIG. 1, data is programmed into the memory cells included in the first memory cell group 1MCG and the memory cells included in the second memory cell group 2MCG.

The memory cells included in the first memory cell group 1MCG are programmed into at least six different states. The memory cells included in the second memory cell group 2MCG are also programmed into at least six different states. For example, the memory cells included in the first memory cell group 1MCG are programmed into an erase state ER or any one of a first program state P1 to a fifth program state P5, and the memory cells included in the second memory cell group 2MCG are also programmed into the erase state ER or any one of the first program state P1 to the fifth program state P5.

A read operation of the selected memory block is performed on each of the first memory cell group 1MCG and the second memory cell group 2MCG. Data output is determined by a threshold voltage of a selected memory cell of the first memory cell group 1MCG and a threshold voltage of a selected memory cell of the second memory cell group 2MCG. For example, the threshold voltage may be determined by the data read from the first memory cell group 1MCG, and the threshold voltage may be determined by the data read from the second memory cell group 2MCG. Different data codes DC are generated by combining the threshold voltages determined by the memory cell groups 1MCG and 2MCG. When M bits of data are programmed into the memory cells of the memory cell groups 1MCG and 2MCG, the memory cells included in the memory cell groups 1MCG and 2MCG have six threshold voltage distributions. For example, M is N/k, where M and N are each a positive integer. N refers to the quantity of bits of each of the data codes, and k is the quantity of drain select lines that are different from each other on the same layer, where k is a positive integer. The values M, N, and k, and the number of threshold voltage distributions vary depending on the memory device. The quantity Ndt of different data codes DC is two to the Nth power. For example, when 2.5 bits of data are programmed into the memory cells corresponding to the drain select lines DSL1 and DSL2, the quantity Ndt of data codes DC is 2 to the fifth power, which is 32. A quantity of bits of data stored in the memory cells is other than 2 raised to an Nth power, where N is a number of bits in each of the data codes. N may be any integer greater than 2, including at least five bits of data.

For example, the data code DC includes five bits of data. The five bits of data include first logical data 1LD to fifth logical data 5LD. For example, each of the logical data 1LD to 5LD is 1-bit data. In other words, the data code DC is a code that consists of five bits corresponding to the logical data 1LD to 5LD.

During the program operation, the data is distributed and programmed into the memory cells corresponding to the first drain select line DSL1 and the second drain select line DSL2. The data codes that are output during the read operation are determined by the states of the memory cells corresponding to the first drain select line DSL1 and the second drain select line DSL2.

Figure 15:
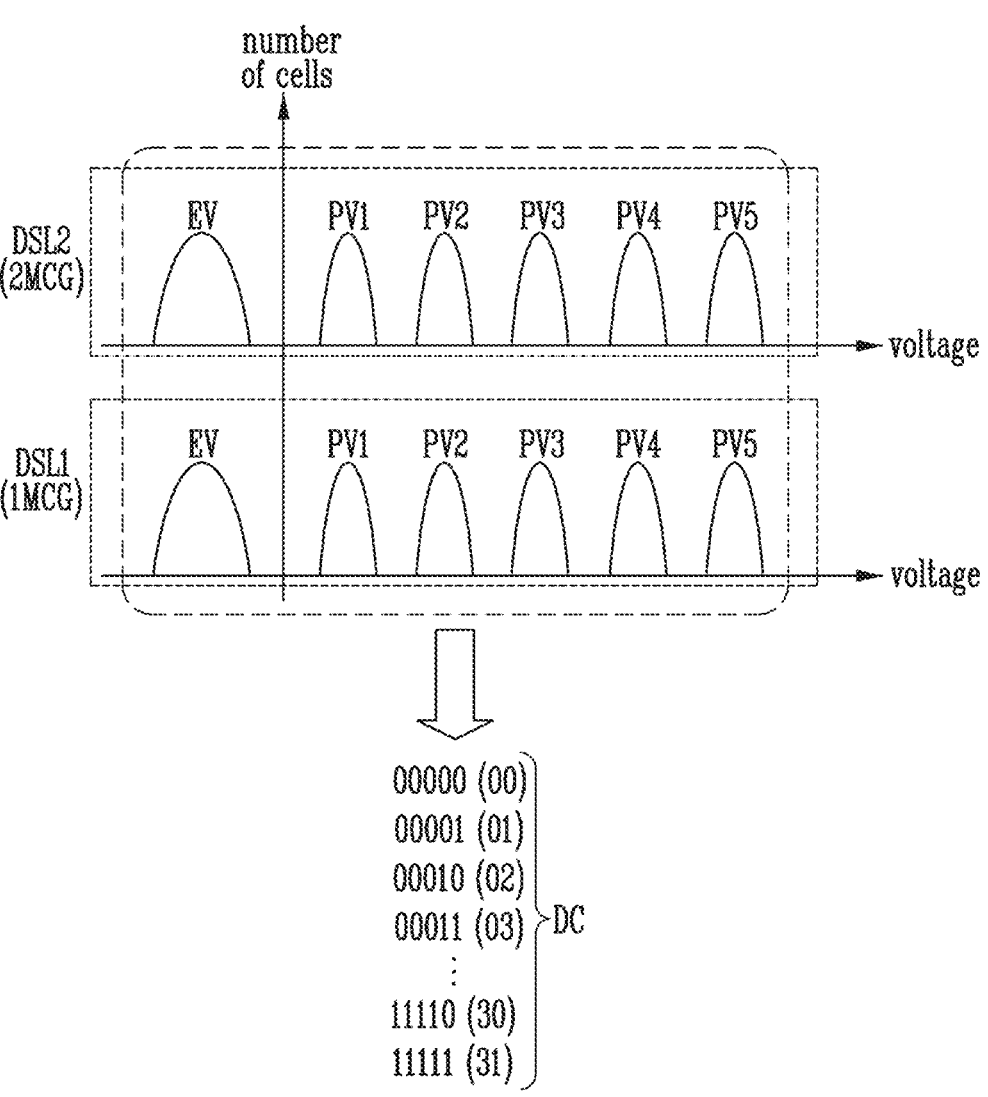
FIG. 15 is a diagram illustrating a threshold voltage distribution of memory cells corresponding to different drain select lines and data codes.

FIG. 15 is a diagram illustrating threshold voltage distributions of memory cells corresponding to different drain select lines and data codes.

Referring to FIG. 15, memory cells that are included in the first memory cell group 1MCG corresponding to the first drain select line DSL1 and the memory cells included in the second memory cell group 2MCG corresponding to the second drain select line DSL2 are programmed during a program operation of a selected memory block. For example, memory cells included in a selected page among the memory cells included in the first memory cell group 1MCG are programmed into an erase state or any one of the first to fifth program states. Similarly, memory cells included in a selected page among the memory cells included in the second memory cell group 2MCG are programmed into an erase state or any one of the first to fifth program states. Memory cells that are in the erase state are at an erase threshold voltage EV. Memory cells that are in the first program state higher than the erase state are at a first program threshold voltage PV1 greater than the erase threshold voltage EV. Memory cells that are in the second program state higher than the first program state are at a second program threshold voltage PV2 greater than the first program threshold voltage PV1. Memory cells that are in the third program state higher than the second program state are at a third program threshold voltage PV3 greater than the second program threshold voltage PV2. Memory cells that are in the fourth program state higher than the third program state are at a fourth program threshold voltage PV4 greater than the third program threshold voltage PV3. Memory cells that are in the fifth program state higher than the fourth program state are at a fifth program threshold voltage PV5 higher than the fourth program threshold voltage PV4.

For example, a program operation is performed such that the memory cells of the first memory cell group 1MCG are divided into six threshold voltage distributions EV and PV1 to PV5. The fewer threshold voltage distributions, the wider the difference is between consecutive threshold voltage distributions corresponding to different states. As a result, overlap between threshold voltage distributions may be reduced, and the reliability of a program operation may be improved. A program operation is performed on the second memory cell group 2MCG in a similar manner as performed on the first memory cell group 1MCG. Accordingly, when the program operation is performed on the selected page of each of the memory cell groups 1MCG and 2MCG, the memory cells included in each of the memory cell groups 1MCG and 2MCG are maintained at the erase state ER or are programmed into any one of the first to fifth program states.

A read operation of the selected memory block is performed by outputting data codes DC that are generated by combining threshold voltages of each of the first memory cell group 1MCG and the second memory cell group 2MCG. For example, the memory cells included in each of the memory cell groups 1MCG and 2MCG are at the erase threshold voltage EV or any one of the program threshold voltages PV1 to PV5. When the six threshold voltages of the memory cells of the first memory cell group 1MCG and the six threshold voltages of the memory cells of the second memory cell group 2MCG are combined, a total of 36 data codes DC are generated.

In this example, all 36 data codes may not be used, and some codes with relatively low reliability may be excluded from use in an active set of data codes. For example, a data code corresponding to a combination of threshold voltages among different memory cell groups with a relatively large difference between a threshold voltage of the first memory cell group 1MCG and a threshold voltage of the second memory cell group 2MCG is excluded from use. The combination with the relatively large difference in threshold voltage includes, for example, a combination of the erase threshold voltage EV and the fifth program threshold voltage PV5 or a combination of the erase threshold voltage EV and the fourth program threshold voltage PV4. For example, data codes corresponding to combinations of the erase threshold voltage EV of the first memory cell group 1MCG and the fourth program threshold voltage PV4 or the fifth program threshold voltage PV5 of the second memory cell group 2MCG are excluded. In addition, data codes corresponding to combinations of the erase threshold voltage EV of the second memory cell group 2MCG and the fourth program threshold voltage PV4 or the fifth program threshold voltage PV5 of the first memory cell group 1MCG are also excluded. Therefore, the data codes DC may include 32 codes with the exclusion of four codes excluded from the 36 codes generated by 6×6. In FIG. 15, numbers in parentheses, for example, 00 to 31, refer to the binary data codes DC converted into decimal numerals.

The data codes DC may include different types of data including 5 bits. The data codes DC may include gray codes or may include data regardless of gray codes. Alternatively, only some of the data codes DC may be gray codes.

FIG. 16 is table including data codes according to an embodiment.

Referring to FIG. 16, the data codes include different codes that are established according to threshold voltage combinations of the memory cell groups 1MCG and 2MCG. The data codes shown in FIG. 16 provide an example of the principles of the present disclosure. In addition to the codes shown in FIG. 16, 5-bit codes may be variously designed to constitute data codes. Referring to the example data codes shown in FIG. 16, a data code corresponding to a combination of the erase threshold voltage EV of the first memory cell group 1MCG and the erase threshold voltage EV of the second memory cell group 2MCG is '11111'. Numbers in parentheses in FIG. 16 refer to the corresponding decimal numeral for the data codes. A data code corresponding to a combination of the erase threshold voltage EV of the first memory cell group 1MCG and the first program threshold voltage PV1 of the second memory cell group 2MCG is 11101. A data code corresponding to a combination of the fourth program threshold voltage PV4 of the first memory cell group 1MCG and the fifth program threshold voltage PV5 of the second memory cell group 2MCG is 01101. A different code is assigned to each different combination of threshold voltages of the first memory cell group 1MCG and threshold voltages of the second memory cell group 2MCG.

The data codes are divided into first data codes 1DC and second data codes 2DC according to a reference threshold voltage Pv. For example, the reference threshold voltage Pv is any one of the threshold voltages of each of the memory cell groups 1MCG and 2MCG. The reference threshold voltage Pv may be a threshold voltage that causes deterioration in reliability of data programmed into memory cells due to an increase in difference between the threshold voltage and the lowest threshold voltage. FIG. 16 shows an embodiment in which the fourth program threshold voltage PV4 is identified as the reference threshold voltage Pv.

In this example, the erase threshold voltage EV and the first program threshold voltage PV1 to the third program threshold voltage PV3 of the first memory cell group 1MCG are included in a first threshold voltage group 1VG, the fourth program threshold voltage PV4 and the fifth program threshold voltage PV5 of the first memory cell group 1MCG are included in a second threshold voltage group 2VG, the erase threshold voltage EV and the first program threshold voltage PV1 to the third program threshold voltage PV3 of the second memory cell group 2MCG are included in the third threshold voltage group 3VG, and the fourth program threshold voltage PV4 and the fifth program threshold voltage PV5 of the second memory cell group 2MCG are included in a fourth threshold voltage group 4VG.

Combinations of the threshold voltages included the threshold voltage groups 1VG and 3VG are included in the first data codes 1DC. Combinations of the threshold voltages included in the threshold voltage groups 2VG and 4VG are included in the second data codes 2DC. A combination of codes included in the first data codes 1DC have a smaller voltage difference than a combination of codes included in the second data codes 2DC. As a result, the combination of the codes included in the first data codes 1DC have a higher reliability than the combination of the codes included in the second data codes 2DC. Consequently, some codes from the second data codes 2DC may be excluded from use. A combination corresponding to excluded codes may be, for example, an inactive combination None. For example, among the codes included in the second data code 2DC, a combination of codes corresponding to threshold voltages with a voltage difference greater than a reference voltage are included in the inactive combinations None.

For example, the inactive combinations None are combinations of the fourth program threshold voltage PV4 of the first memory cell group 1MCG and the erase threshold voltage EV of the second memory cell group 2MCG, a combination of the fifth program threshold voltage PV5 of the first memory cell group 1MCG and the erase threshold voltage EV of the second memory cell group 2MCG, a combination of the erase threshold voltage EV of the first memory cell group 1MCG and the fifth threshold voltage PV5 of the second memory cell group 2MCG, and a combination of the erase threshold voltage EV of the first memory cell group 1MCG and the fourth threshold voltage PV4 of the second memory cell group 2MCG. The inactive combinations None may vary depending on each memory device because the inactive combinations None are established to remove threshold voltage combinations of memory cells that are likely to be changed from the memory cell groups 1MCG and 2MCG during or after a program operation.

FIG. 17 is a flowchart illustrating a program operation according to an embodiment of the present disclosure.

Referring to FIG. 17, when a program operation of a selected memory block starts, the logic circuit 170 of FIG. 1 divides S171 program data, which is input into a memory device, into first data and second data for the program operation. The first data is programmed into a first memory cell group corresponding to a first drain select line. The second data is programmed into a second memory cell group corresponding to a second drain select line. The first data programmed into the first memory cell group and the second data programmed into the second memory cell group are input into the page buffer group 140 of FIG. 1.

The first data, among the first and second data input to the page buffer group 140 of FIG. 1, are programmed S172 into the first memory cell group corresponding to the first drain select line. For example, a program permission voltage or a program inhibition voltage may be applied to bit lines in response to the first data. The program permission voltage may be less than a program voltage that is applied to the selected word line and may be a positive voltage at one of various different levels that are 0V or greater than 0V. The program inhibition voltage is applied to prevent threshold voltages of memory cells from increasing by reducing a voltage difference between the program voltage and a channel. The program inhibition voltage may be a positive voltage that is greater than the program permission voltage. When the first data is programmed into the first memory cell group, a turn-on voltage is applied to the first drain select line to select the first memory cell group corresponding to the first drain select line. A turn-off voltage is applied to the second drain select line to unselect or deselect the second memory cell group corresponding to the second drain select line. The program voltage is applied to the selected word line, and a pass voltage is applied to unselected word lines except for a selected word line. The program voltage is applied to increase a threshold voltage of the selected memory cell group and may be a positive voltage greater than 0V. The pass voltage forms a channel by turning on the unselected memory cell group and may be a positive voltage greater than 0V and less than the program voltage.

When the program operation of the first memory cell group is completed, the second data, among the first and second data input to the page buffer group 140 of FIG. 1, are programmed S173 the second memory cell group corresponding to the second drain select line. For example, the program permission voltage or the program inhibition voltage may be applied to the bit lines in response to the second data. When the second data is programmed into the second memory cell group, the turn-on voltage is applied to the second drain select line to select the second memory cell group corresponding to the second drain select line. The turn-off voltage is applied to the first drain select line to unselect or deselect the first memory cell group corresponding to the first drain select line. The program voltage is applied to the selected word line, and the pass voltage is applied to unselected word lines except for a selected word line.

As described above, during the program operation according to an embodiment, the program data are distributed and programmed into the first and second memory cell groups corresponding to the first and second drain select lines. The order in which the first and second drain select lines are selected may be any order. The logic circuit 170 of FIG. 1 controls the operating code OPCD FIG. 1 such that the turn-on voltage is applied to the first drain select line or the turn-off voltage is applied to the second drain select line, or such that the turn-off voltage is applied to the first drain select line and the turn-on voltage is applied to the second drain select line during the program operation. The processes of the flowchart of FIG. 17 may be performed in a different order and may include fewer or additional processes than described above and as shown in FIG. 17.

Figure 18:
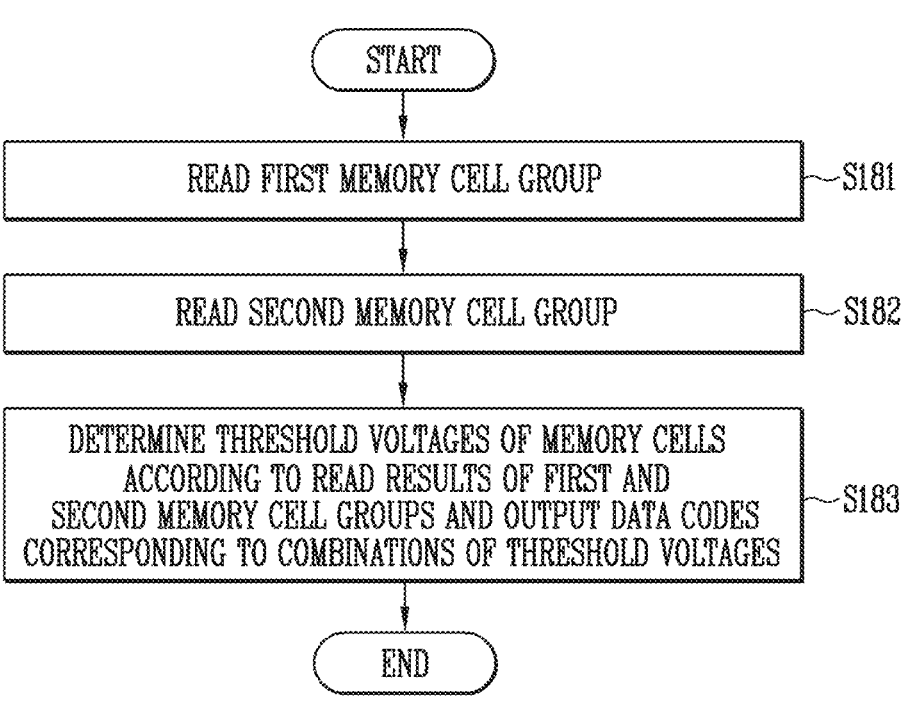
FIG. 18 is a flowchart illustrating a read operation according to an embodiment of the present disclosure.

FIG. 18 is a flowchart illustrating a read operation according to an embodiment of the present disclosure.

Referring to FIG. 18, when a read operation of a selected memory block starts, the logic circuit 170 of FIG. 1 reads S181 a first memory cell group corresponding to a first drain select line. For example, bit lines coupled to the selected memory block are precharged to a positive voltage, a turn-on voltage is applied to the first drain select line, and a turn-off voltage is applied to a second drain select line. Currents or voltages of bit lines are maintained at a previous level or are lowered in response to threshold voltages of memory cells included in the first memory cell group. The page buffer group 140 of FIG. 1 stores a read result by sensing the currents or voltages of the bit lines. For example, the read result may be determined by 0 or 1 data and stored in a latch of each of the page buffers included in the page buffer group 140 FIG. 1.

When reading the first memory cell group is completed, the logic circuit 170 of FIG. 1 reads S182 a second memory cell group corresponding to the second drain select line. For example, the bit lines coupled to the selected memory block are precharged to the positive voltage, the turn-off voltage is applied to the first drain select line, and the turn-on voltage is applied to the second drain select line. Currents or voltages of the bit lines are maintained at a previous level or lowered in response to threshold voltages of the memory cells included in the first memory cell group. The page buffer group 140 of FIG. 1 stores a read result by sensing the currents or voltages of the bit lines. For example, the read result may be determined by 0 or 1 data and stored in a latch of each of the page buffers included in the page buffer group 140 FIG. 1.

The data code manager 171 included in the logic circuit 170 as shown in FIG. 1 receives the read result that is input to the page buffer group 140 of FIG. 1, determines S183 threshold voltages of the memory cells included in the first and second memory cell groups according to the received read result, and outputs data codes corresponding to combinations of the threshold voltages. For example, when a current or a voltage of a bit line is maintained at the previous level, the current is lowered to be less than a reference current, or the voltage is not less than a reference voltage, the corresponding memory cell is determined as a cell having a greater threshold voltage than a read voltage. When the current of the bit line is greater than the reference current, or the voltage is less than the reference voltage, the corresponding memory cell is determined to have a threshold voltage less than a read voltage.

The data code manager 171 of FIG. 1 generates a data code by combining a threshold voltage of the first memory cell group and a threshold voltage of the second memory cell group to output the generated data code. For example, the data code manager 171 of FIG. 1 includes data code information corresponding to the threshold voltage of the first memory cell group and the threshold voltage of the second memory cell group. When receiving the read result from the page buffer group 140 of FIG. 1, the data code manager 171 outputs a selected data code from the data code information to the page buffer group 140 of FIG. 1 in response to the read result. The page buffer group 140 of FIG. 1 transfers the data code, which is received from the data code manager 171 of FIG. 1, to the input/output circuit 160 of FIG. 1. The input/output circuit 160 of FIG. 1 outputs the data code to an external device through the input/output lines I/O. The external device may include a controller that generates and transfers a command and an address to the memory device 100. The processes of the flowchart of FIG. 18 may be performed in a different order and may include fewer or additional processes than described above and as shown in FIG. 18.

Figure 19:
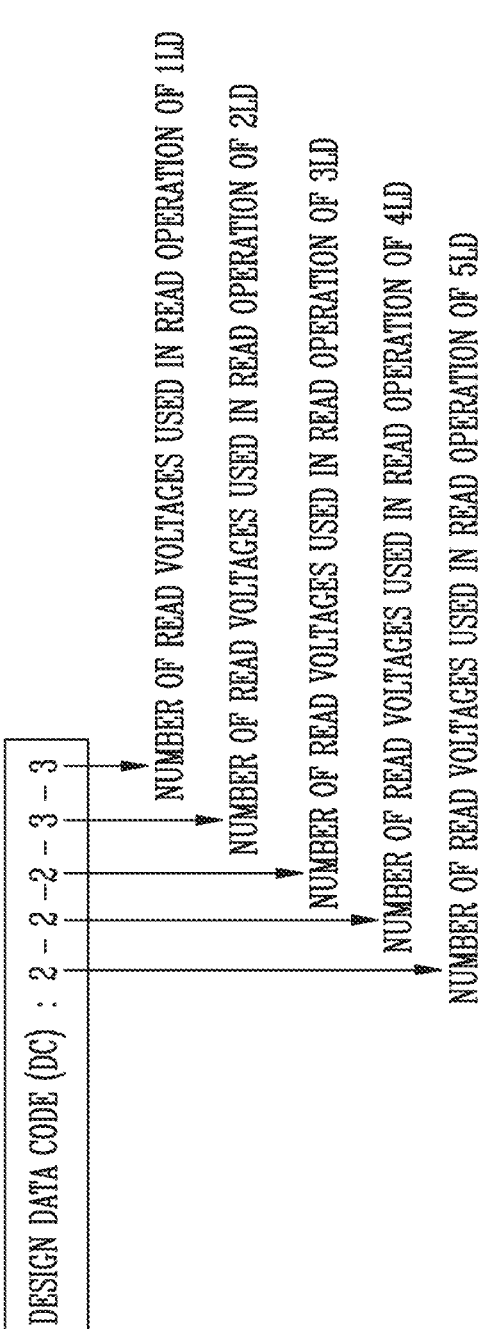
FIG. 19 is a diagram illustrating quantities of read voltages utilized in a method of designing data codes according to an embodiment of the present disclosure.

FIG. 19 is a diagram illustrating quantities of read voltages utilized in a method of designing a data code according to an embodiment of the present disclosure.

Referring to the example of FIG. 19, the data code DC includes five bits of data. The five bits of data include the first logical data 1LD to the fifth logical data 5LD. Each of the logical data 1LD to 5LD includes 1-bit data. The logical data 1LD to 5LD is designed to differentiate threshold voltages of memory cells corresponding to a first drain select line from threshold voltages of memory cells corresponding to a second drain select line. During an operation including reading each of the first logical data 1LD to the fifth logical data 5LD, the maximum quantity of read voltages used in the read operation of the selected logical data is the quantity of bits of the data stored in each of the memory cells. For example, when the memory cells utilize six threshold voltage distributions, a maximum of three read voltages is used during a read operation of each of the logical data 1LD to 5LD. For example, threshold voltages corresponding to the first logical data 1LD are divided from each other by using three read voltages, and threshold voltages corresponding to the second logical data 2LD are also divided from each other by using three read voltages. Threshold voltages corresponding to the third logical data 3LD are divided from each other by using two read voltages. Threshold voltages corresponding to the fourth logical data 4LD are divided from each other by using two read voltages. Threshold voltages corresponding to the fifth logical data 5LD are divided from each other by using two read voltages. In order to reduce the time taken to perform the read operation, the data code DC is designed to reduce the number of read voltages used in the read operation. The logical data 1LD to 5LD are described in detail with reference to FIG. 20.

Figure 20:
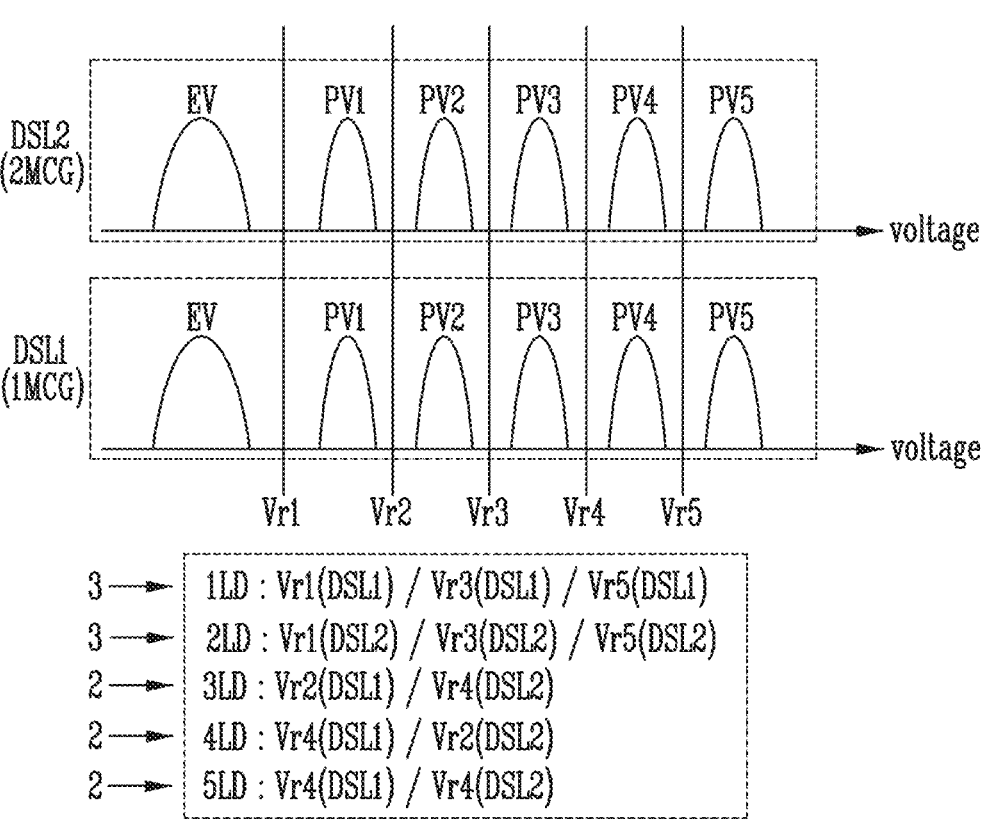
FIG. 20 is a voltage diagram during a read operation according to an embodiment of the present disclosure.

FIG. 20 is a voltage diagram during a read operation according to an embodiment of the present disclosure.

Referring to FIG. 20, memory cells of the first memory cell group 1MCG corresponding to the first drain select line DSL1 are at the erase threshold voltage EV or any one of the threshold voltages PV1 to PV5. Similarly, memory cells of the second memory cell group 2MCG corresponding to the second drain select line DSL2 are also at the erase threshold voltage EV or any one of the threshold voltages PV1 to PV5. First read voltage Vr1 to fifth read voltage Vr5 are used to differentiate the erase threshold voltage EV and the program threshold voltages PV1 to PV5 from each other. For example, the first read voltage Vr1 is used to differentiate the erase threshold voltage EV from the first program threshold voltage PV1, the second read voltage Vr2 is used to differentiate the first and second program threshold voltages PV1 and PV2 from each other, the third read voltage Vr3 is used to differentiate the second and third program threshold voltages PV2 and PV3, the fourth read voltage Vr4 is used to differentiate the third and fourth program threshold voltages PV3 and PV4 from each other, and the fifth read voltage Vr5 is used to differentiate the fourth and fifth program threshold voltages PV4 and PV5 from each other.

For example, the first logical data 1LD is read using the first read voltage Vr1, the third read voltage Vr3, and the fifth read voltage Vr5 corresponding to the first drain select line DSL1. The second logical data 2LD is read using the first read voltage Vr1, the third read voltage Vr3, and the fifth read voltage Vr5 corresponding to the second drain select line DSL2. The third logical data 3LD is read using the second read voltage Vr2 corresponding to the first drain select line DSL1 and the fourth read voltage Vr4 corresponding to the second drain select line DSL2. The fourth logical data 4LD is read using the fourth read voltage Vr4 corresponding to the first drain select line DSL1 and the second read voltage Vr2 corresponding to the second drain select line DSL2. The fifth logical data 5LD is read using the fourth read voltage Vr4 corresponding to the first drain select line DSL1 and the fourth read voltage Vr4 corresponding to the second drain select line DSL2.

FIG. 21 is table including data codes according to an embodiment of the present disclosure.

Referring to FIG. 21, the inactive combinations None in the table of FIG. 21 are different from the inactive combinations in the table of FIG. 16. For example, the inactive combinations None are included in the second data codes 2DC, and a combination of the erase threshold voltage EV of the first memory cell group 1MCG and the fourth program threshold voltage PV4 of the second memory cell group 2MCG is an inactive combination None, and a combination of the first program threshold voltage PV1 of the first memory cell group 1MCG and the fifth program threshold voltage PV5 of the second memory cell group 2MCG is an active code.

For example, in the data codes according to the table of FIG. 21, the inactive combinations None include a combination of the fifth program threshold voltage PV5 that has the largest voltage difference from the erase threshold voltage EV of the second memory cell group 2MCG and the fourth program threshold voltage PV4 with the next largest voltage difference, among the erase threshold voltage EV and the program threshold voltages PV1 to PV5 of the first memory cell group 1MCG. In addition, the inactive combinations None include a combination of the fifth program threshold voltage PV5 with the largest voltage difference from the erase threshold voltage EV of the first memory cell group 1MCG and the fourth program threshold voltage PV4 with the next largest voltage difference, among the erase threshold voltage EV and the program threshold voltages PV1 to PV5 of the second memory cell group 2MCG.

The inactive combinations None remove threshold voltage combinations of memory cells, whose threshold voltages are likely to be changed during or after the program operation. The inactive combinations None may vary depending on each memory device.

FIG. 22 is another table including data codes according to the present disclosure.

Referring to FIG. 22, the data codes according to the table of FIG. 22 include first data codes that do not include the inactive combinations None and second data codes that include the inactive combinations None. For example, the first data codes are composed of combinations of threshold voltages included in the first threshold voltage group 1VG corresponding to the first memory cell group 1MCG and the third threshold voltage group 3VG corresponding to the second memory cell group 2MCG. Each of the first threshold voltage group 1VG and the third threshold voltage group 3VG includes the erase threshold voltage EV and the first to mth program threshold voltages PV1 to PVm, where m is a positive integer. The second data codes are composed of combinations of threshold voltages included in the second threshold voltage group 2VG corresponding to the first memory cell group 1MCG and the fourth threshold voltage group 4VG corresponding to the second memory cell group 2MCG. Each of the second voltage group 2VG and the fourth threshold voltage group 4VG include (m+1) to nth program threshold voltages PV (m+1) to PVn, where n is a positive integer greater than m.

The inactive combinations None are included in the second data codes. For example, a combination of the erase threshold voltage EV included in the third threshold voltage group 3VG and the program threshold voltages PV (m+1) to PVn included in the second threshold voltage group 2VG are inactive combinations None. A combination of the lowest erase threshold voltage EV included in the first threshold voltage group 1VG and the program threshold voltages PV (m+1) to PVn included in the fourth threshold voltage group 4VG are inactive combinations None.

In addition to the data codes described above, the inactive combinations None may be variously designed.

Figure 23:
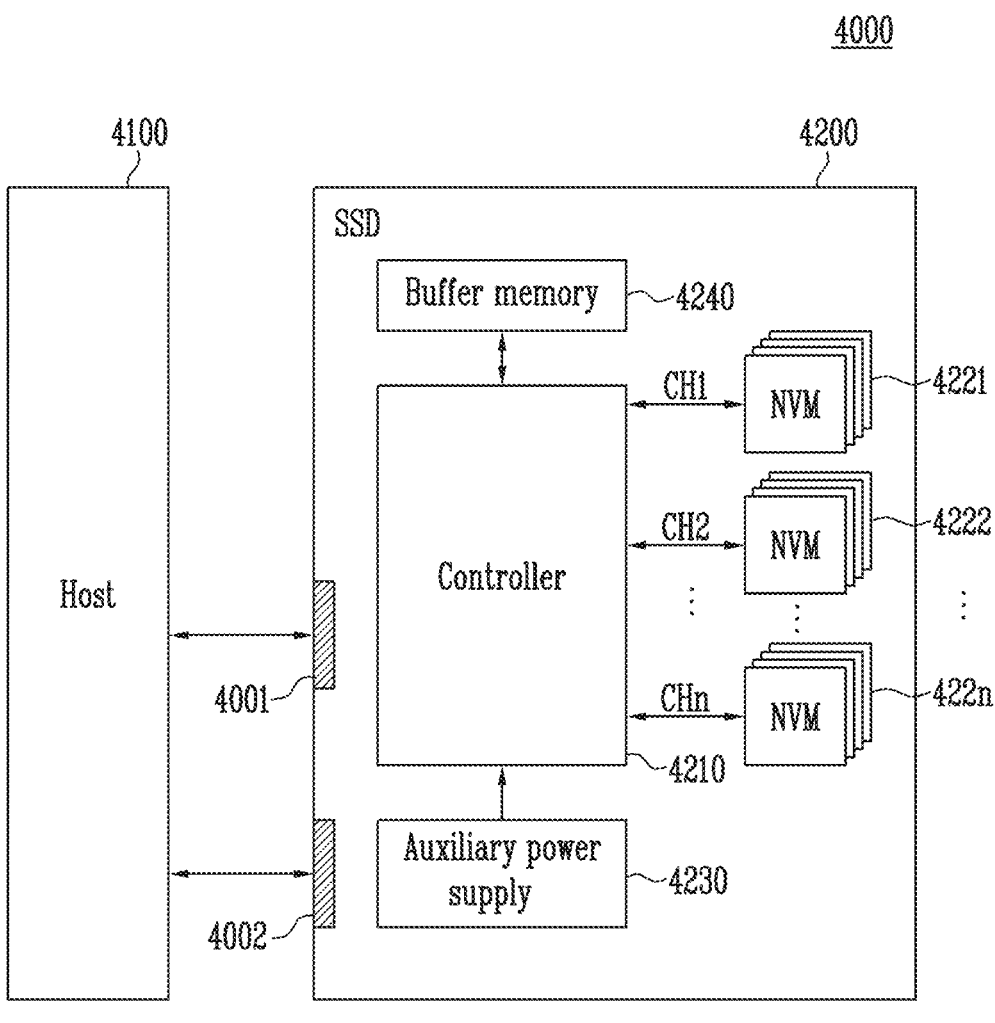
FIG. 23 is a diagram illustrating a solid state drive including a memory device according to the present disclosure.

FIG. 23 is a block diagram illustrating a solid state drive (SSD) system 4000 including a memory device according to an embodiment of the present disclosure.

Referring to FIG. 23, the SSD system 4000 includes a host 4100 and an SSD 4200. The SSD 4200 exchanges signals with the host 4100 through a signal connector 4001 and receives power through a power connector 4002. The SSD 4200 includes a controller 4210, a plurality of flash memories 4221 to 422n, an auxiliary power supply 4230, and a buffer memory 4240.

According to the present disclosure, each of the plurality of flash memories 4221 to 422n is configured similarly to the memory device 100 described above with reference to FIG. 1. For example, each of the plurality of flash memories 4221 to 422n is configured with a data code manager 171 configured to differentiate data corresponding to different drain select lines and generate data codes according to threshold voltages corresponding to the divided data.

The controller 4210 controls the plurality of flash memories 4221 to 422n in response to signals received from the host 4100. In an embodiment, the signals are based on the interfaces of the host 4100 and the SSD 4200. For example, the signals may be configured or constructed according to at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wifi, Bluetooth, and nonvolatile memory express (NVMe) interfaces.

The auxiliary power supply 4230 is coupled to the host 4100 through the power connector 4002. The auxiliary power supply 4230 is supplied and charged with power from the host 4100. The auxiliary power supply 4230 supplies the power to the SSD 4200 when the power is not smoothly or consistently supplied by the host 4100. In an embodiment, the auxiliary power supply 4230 may be positioned inside or outside the SSD 4200. For example, the auxiliary power supply 4230 may be disposed on a main board and may supply auxiliary power to the SSD 4200.

The buffer memory 4240 serves as a buffer memory for the SSD 4200. For example, the buffer memory 4240 temporarily stores data received from the host 4100 or data received from the plurality of flash memories 4221 to 422n, or may temporarily store metadata, for example, mapping tables, of the flash memories 4221 to 422n. The buffer memory 4240 may include volatile memories such as DRAM, SDRAM, DDR SDRAM, and LPDDR SDRAM or nonvolatile memories such as FRAM, ReRAM, STT-MRAM, and PRAM.

Figure 24:
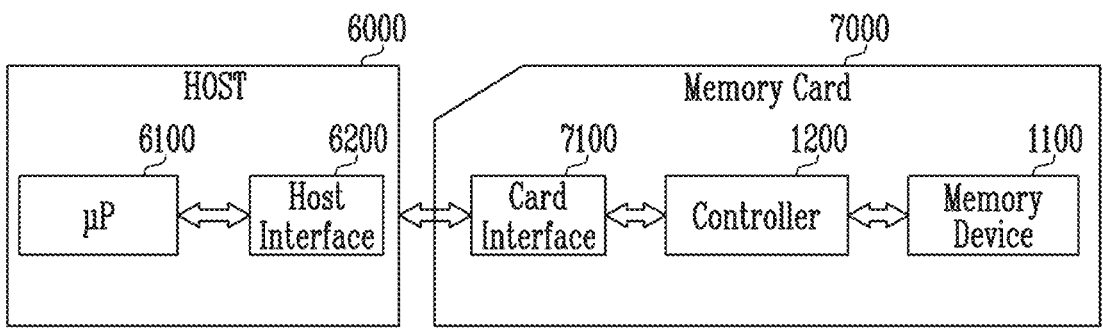
FIG. 24 is a diagram illustrating a memory card system including a memory device according to the present disclosure.

FIG. 24 is a diagram illustrating a memory system 7000 including a memory device according to an embodiment of the present disclosure.

Referring to FIG. 24, the memory system 7000 may be a memory card or a smart card. The memory system 7000 includes a memory device 1100, a controller 1200, and a card interface 7100.

The memory device 1100 is configured similarly to the memory device 100 shown in FIG. 1. For example, the memory device 1100 is configured with a data code manager 171 configured to differentiate data corresponding to different drain select lines and generate data codes according to threshold voltages corresponding to the divided data.

The controller 1200 controls data exchange between the memory device 1100 and the card interface 7100. According to an embodiment, the card interface 7100 may be, but is not limited to, a secure digital (SD) card interface or a multimedia card (MMC) interface.

The card interface 7100 provides an interface for data exchange between a host 6000 and the controller 1200 according to a protocol of the host 6000. The card interface 7100 may support a Universal Serial Bus (USB) protocol, an InterChip (IC)-USB protocol, and so forth. in this example, the card interface 7100 may refer to hardware capable of supporting a protocol that is used by the host 6000, software installed in the hardware, and/or a signal transmission method.

When the memory system 7000 is connected to a host interface 6200 of the host 6000 such as a PC, a tablet PC, a digital camera, a digital audio player, a mobile or cellular phone, console video game hardware, a digital set-top box, and so forth, the host interface 6200 performs data communication with the memory device 1100 through the card interface 7100 and the controller 1200 in response to control by a microprocessor 6100.

According to the present disclosure, the reliability of a memory device may be improved.

Various modifications can be made to the above-described embodiments without departing from the spirit or scope of the disclosure. All changes within the meaning and range of equivalency of the claims are to be included within their scope.

What is claimed is:

1. A method of operating a memory device, the method comprising:
   programming program data by distributing the program data to a first memory cell group corresponding to a first drain select line and a second memory cell group corresponding to a second drain select line during a program operation of a selected memory block;
   reading memory cells included in each of the first memory cell group and the second memory cell group during a read operation of the selected memory block; and
   determining threshold voltages for the first memory cell group according to a read result for the first memory cell group and threshold voltages for the second memory cell group according to a read result for the second memory cell group and outputting data codes corresponding to combinations of the threshold voltages during a read operation of the selected memory block.

2. The method of claim 1, wherein the program operation is performed by storing data in each of the memory cells, where a quantity of bits of the data is other than 2 raised to an Nth power, where N is a number of bits in each of the data codes.

3. The method of claim 1, wherein reading the memory cells included in each of the first memory cell group and the second memory cell group comprises:
   reading the memory cells included in the first memory cell group corresponding to the first drain select line; and
   reading the memory cells included in the second memory cell group corresponding to the second drain select line.

4. The method of claim 1, wherein during reading of the memory cells included in the first memory cell group, the threshold voltages of the memory cells included in the first memory cell group are determined, and
   wherein during reading of the memory cells included in the second memory cell group, the threshold voltages of the memory cells included in the second memory cell group are determined.

5. The method of claim 1, wherein the data codes include different codes corresponding to the threshold voltages determined according to the read result for the first memory cell group and the threshold voltages determined according to the read result for the second memory cell group.

6. The method of claim 1, wherein the data codes include at least five bits of data.

7. The method of claim 1, wherein a code corresponding to a combination with a largest voltage difference between the threshold voltages of the first memory cell group and the threshold voltages of the second memory cell group is excluded from the data codes.

8. The method of claim 7, wherein a code corresponding to a combination with a second largest voltage difference between the threshold voltages of the first memory cell group and the threshold voltages of the second memory cell group is excluded from the data codes.

9. A method of operating a memory device, the method comprising:
   programming M bits of data into memory cells selected by select lines, where M is a real number;
   reading the memory cells according to each of the select lines; and
   outputting data codes by combining read results of the memory cells corresponding to each of the select lines,
   wherein each of the data codes comprises N bits, and N is greater than M.

10. The method of claim 9, wherein the memory cells are programmed with fewer threshold voltage distributions than two raised to an Nth power.

11. The method of claim 9, wherein M corresponds to N/k and k is a quantity of the select lines.

12. The method of claim 9, wherein a quantity of data codes is two raised to the Nth power.

13. The method of claim 9, wherein a code corresponding to a largest voltage difference between threshold voltages of the memory cells corresponding to different select lines is excluded from the data codes.

14. The method of claim 13, wherein codes corresponding to voltage differences smaller than the largest voltage difference between the threshold voltages of the memory cells are excluded from the data codes.

15. A method of operating a memory device, the method comprising:

identifying first threshold voltages corresponding to a first memory cell group and second threshold voltages corresponding to a second memory cell group;

generating first data codes by combining threshold voltages, among the first and second threshold voltages, included between a minimum threshold voltage and a reference threshold voltage;

generating second data codes by combining threshold voltages, among the first and second threshold voltages, included between a threshold voltage greater than the reference threshold voltage and a maximum threshold voltage;

excluding codes for inactive combinations of threshold voltages, which inactive combinations have voltage differences greater than a reference voltage from the second data codes;

determining read voltages according to a quantity of bits stored in each of memory cells included in the first memory cell group and the second memory cell group and performing a first read operation on the first memory cell group and a second read operation on the second memory cell group by using the read voltages; and outputting a selected data code among the first data codes and the second data codes by combining read results from the first read operation and the second read operation.

16. The method of claim 15, wherein the codes of the inactive combinations are not included in the first data codes.

* * * * *